(12) United States Patent
Barlow

(10) Patent No.: US 10,312,360 B2
(45) Date of Patent: Jun. 4, 2019

(54) METHOD FOR PRODUCING TRENCH HIGH ELECTRON MOBILITY DEVICES

(71) Applicant: Stephen P. Barlow, Carmel, IN (US)

(72) Inventor: Stephen P. Barlow, Carmel, IN (US)

(*) Notice: Subject to any disclaimer, the term of this patent is extended or adjusted under 35 U.S.C. 154(b) by 0 days.

(21) Appl. No.: 15/412,141

(22) Filed: Jan. 23, 2017

(65) Prior Publication Data

US 2017/0133362 A1    May 11, 2017

Related U.S. Application Data

(63) Continuation-in-part of application No. 14/307,222, filed on Jun. 17, 2014, now abandoned.

(Continued)

(51) Int. Cl.
*H01L 29/778* (2006.01)
*H01L 29/66* (2006.01)
(Continued)

(52) U.S. Cl.
CPC ...... *H01L 29/7786* (2013.01); *H01L 21/0243* (2013.01); *H01L 21/0254* (2013.01); *H01L 21/02381* (2013.01); *H01L 21/02433* (2013.01); *H01L 21/02458* (2013.01); *H01L 21/266* (2013.01); *H01L 21/26513* (2013.01); *H01L 21/30608* (2013.01); *H01L 21/324* (2013.01); *H01L 29/045* (2013.01); *H01L 29/1095* (2013.01); *H01L 29/2003* (2013.01); *H01L 29/205* (2013.01); *H01L 29/267* (2013.01); *H01L 29/41741* (2013.01); *H01L 29/66462* (2013.01); *H01L 29/66681* (2013.01); *H01L 29/7788* (2013.01); *H01L 29/7789* (2013.01);

(Continued)

(58) Field of Classification Search
CPC ........... H01L 21/0243; H01L 21/02433; H01L 29/7787; H01L 29/7788; H01L 29/7816; H01L 29/66462; H01L 29/7789; H01L 29/7786; H01L 2924/13064; H01L 29/66262

See application file for complete search history.

(56) References Cited

U.S. PATENT DOCUMENTS 5,466,616 A * 11/1995 Yang ................. H01L 29/66674
148/DIG. 168
5,473,176 A * 12/1995 Kakumoto ........ H01L 21/28587
257/192

(Continued)

FOREIGN PATENT DOCUMENTS

JP          2009016655 A        1/2009

*Primary Examiner* — Sophia T Nguyen
(74) *Attorney, Agent, or Firm* — C. John Brannon; Brannon Sowers & Cracraft PC

(57) ABSTRACT

A method for producing a solid state device, including forming a first dielectric layer over an epitaxial layer at least partially covering the a silicon substrate and depositing a photoresist material there-over, removing a predetermined portion first dielectric layer to define an exposed portion, implanting dopants into the exposed portion to define a doped portion, preferentially removing silicon from the exposed portion to generate trenches having V-shaped cross-sections and having first and second angled sidewalls defining the V-shaped cross-section, wherein each angled sidewall defining the V-shaped cross-section is a silicon face having a 111 orientation, and forming a 2DEG on at least one sidewall.

7 Claims, 34 Drawing Sheets

Related U.S. Application Data

Figure 1:
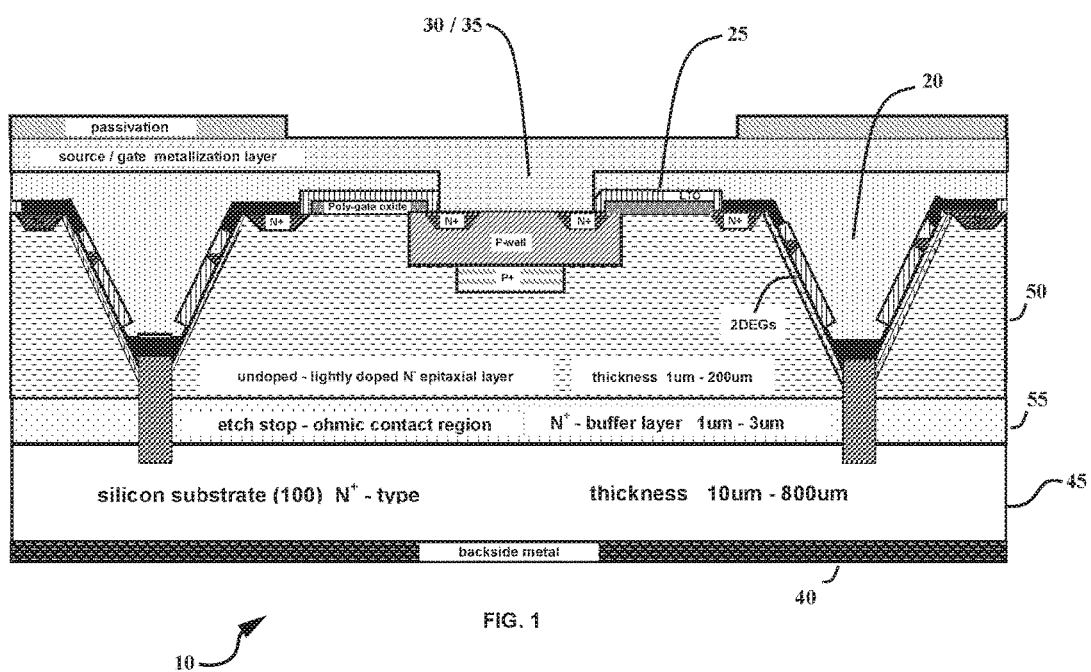
Figure 2:
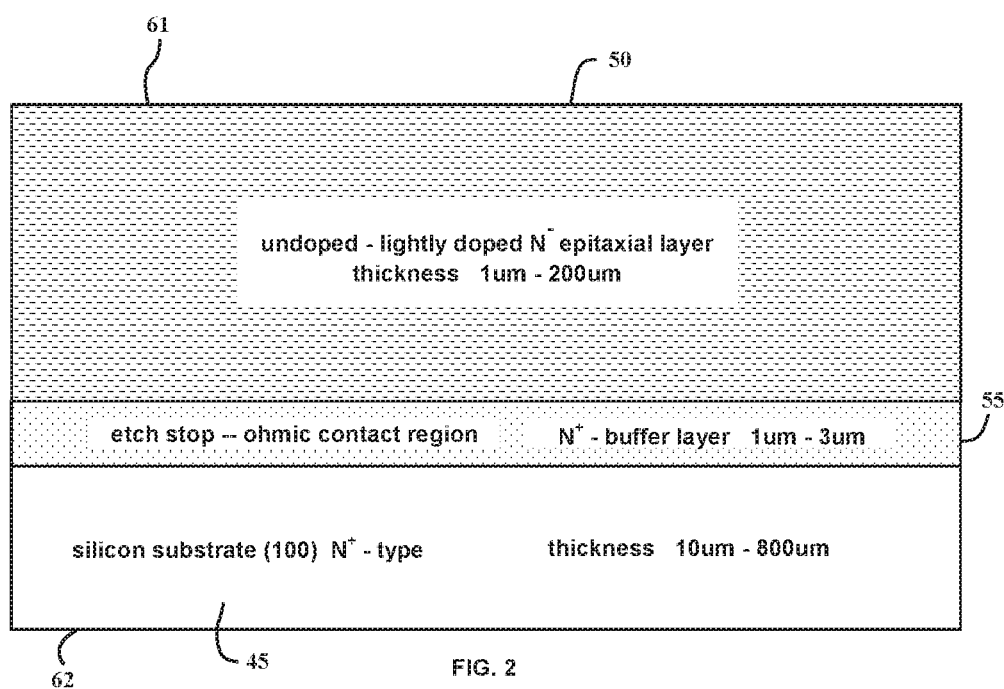
Figure 3:
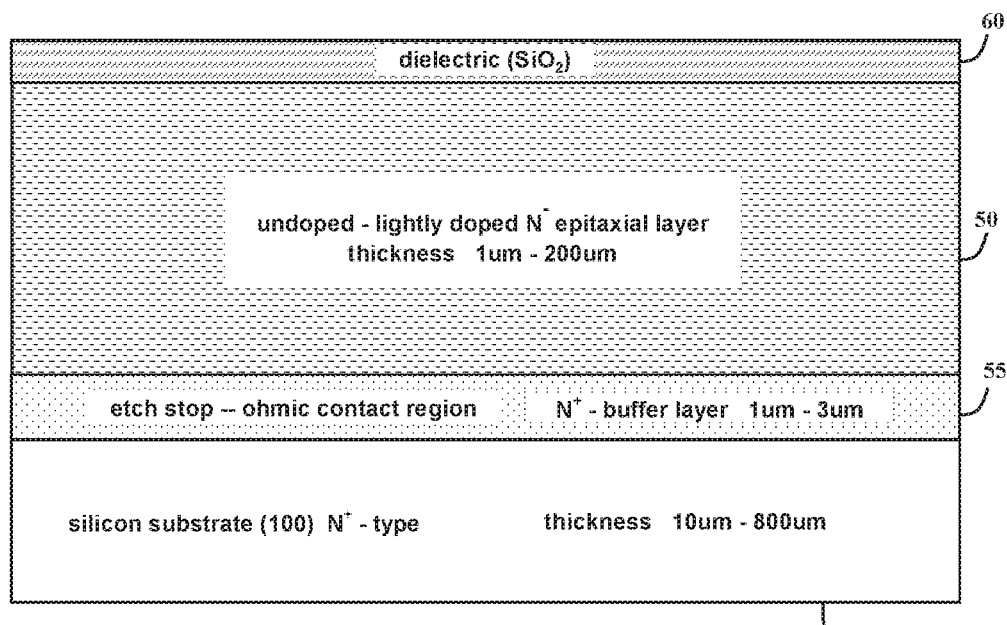

(60) Provisional application No. 62/007,637, filed on Jun. 4, 2014, provisional application No. 61/867,288, filed on Aug. 19, 2013, provisional application No. 61/858,850, filed on Jul. 26, 2013, provisional application No. 61/836,338, filed on Jun. 18, 2013.

(51) Int. Cl.

| | | |
|---|---|---|
| *H01L 21/265* | (2006.01) | |
| *H01L 21/266* | (2006.01) | |
| *H01L 21/324* | (2006.01) | |
| *H01L 21/02* | (2006.01) | |
| *H01L 29/78* | (2006.01) | |
| *H01L 29/20* | (2006.01) | |
| *H01L 29/205* | (2006.01) | |
| *H01L 21/306* | (2006.01) | |
| *H01L 29/267* | (2006.01) | |
| *H01L 29/417* | (2006.01) | |
| *H01L 29/04* | (2006.01) | |
| *H01L 29/10* | (2006.01) | |
| *H01L 21/8258* | (2006.01) | |
| *H01L 29/45* | (2006.01) | |

(52) U.S. Cl.
CPC .... *H01L 29/7816* (2013.01); *H01L 21/26546* (2013.01); *H01L 21/8258* (2013.01); *H01L 29/452* (2013.01); *H01L 2924/13064* (2013.01)

(56) References Cited

U.S. PATENT DOCUMENTS

| | | | | |
|---|---|---|---|---|
| 5,811,336 A * | 9/1998 | Kasai | ............ | H01L 21/823462 257/E21.625 |
| 8,313,963 B2 * | 11/2012 | Pan | ........ | H01L 33/24 438/29 |
| 9,059,075 B2 * | 6/2015 | Bayram | ............ | H01L 29/04 |
| 2002/0182791 A1 * | 12/2002 | Yoshida | .......... | H01L 29/7786 438/194 |
| 2003/0218183 A1 * | 11/2003 | Micovic | .......... | H01L 21/28575 257/192 |
| 2005/0145883 A1 * | 7/2005 | Beach | ............ | H01L 29/7835 257/194 |
| 2007/0228422 A1 * | 10/2007 | Suzuki | ............ | H01L 27/0605 257/213 |
| 2007/0295993 A1 * | 12/2007 | Chen | ............ | H01L 29/2003 257/194 |
| 2008/0179631 A1 * | 7/2008 | Kinzer | ............ | H01L 29/0688 257/194 |
| 2010/0006894 A1 * | 1/2010 | Ohta | ............ | H01L 29/802 257/192 |
| 2010/0044842 A1 * | 2/2010 | Mengel | ............ | H01L 21/561 257/676 |
| 2010/0066348 A1 | 3/2010 | Merz | | |
| 2010/0096668 A1 | 4/2010 | Briere | | |
| 2010/0140663 A1 * | 6/2010 | Hopper | ............ | H01L 29/045 257/194 |
| 2011/0108850 A1 | 5/2011 | Cheng et al. | | |
| 2012/0098599 A1 | 4/2012 | Chang | | |
| 2012/0181548 A1 * | 7/2012 | Okada | ............ | H01L 29/7786 257/76 |
| 2012/0305987 A1 | 12/2012 | Hirler et al. | | |
| 2012/0313106 A1 | 12/2012 | He | | |
| 2013/0153988 A1 * | 6/2013 | Loechelt | ............ | H01L 21/3065 257/329 |
| 2013/0153992 A1 * | 6/2013 | Loechelt | ............ | H01L 29/78 257/330 |
| 2013/0240896 A1 * | 9/2013 | Ozaki | ............ | H01L 29/7786 257/76 |
| 2014/0203388 A1 * | 7/2014 | Becker | ............ | H01L 31/02024 257/432 |
| 2014/0264369 A1 * | 9/2014 | Padmanabhan | ..... | H01L 29/7787 257/76 |
| 2014/0264380 A1 | 9/2014 | Kub | | |
| 2014/0367695 A1 * | 12/2014 | Barlow | ............ | H01L 29/1029 257/76 |
| 2015/0014706 A1 * | 1/2015 | Sadwick | ............ | H01L 29/66431 257/77 |
| 2015/0060942 A1 * | 3/2015 | Kume | ............ | H01L 29/267 257/190 |
| 2015/0162424 A1 | 6/2015 | Briere | | |
| 2017/0133362 A1 * | 5/2017 | Barlow | ............ | H01L 29/66681 |
| 2017/0194476 A1 * | 7/2017 | Brueck | ............ | H01L 21/02381 |

* cited by examiner

| Cross Ref. No. | Layer / Film Type | Material Composition | Layer / Film Typical | Ref. No. |
|---|---|---|---|---|
| 1 | Top-side Passivation | Silicon Nitride | 4-8KA | 1 |
| 2 | Top-side Metal | Aluminum | 4-6um | 2 |
| 3 | Inter-dielectric | Polyimide | 5-300um | 3 |
| 4 | 2DEG Passivation | Silicon Nitride | 1-4KA | 4 |
| 5 | Gate Electrode(s) | Ni/Au | 1-10KA | 5 |
| 6 | 2DEG Metal(s) | Ti/Al/Au | 1/2/1KA | 6 |
| 7 | Substrate | Silicon (100,110) - Undoped or P~$10^{15}$/cm$^3$ | 1-100um | 7 |
| 8 | 2DEG Films | See Figure | | 8 |
| 9 | Cap Layer | GaN Undoped | 10-20A | 9 |
| 10 | GaN 2DEG | Al(25%)/Ga(75%)N | 100-500A | 10 |
| 11 | Buffer Layer(s) | Al(x%)Ga(y%)N (X+Y =100%), GaN | 1-5um | 11 |
| 12 | Neuculation Layer | AlN, AlN/GaN | | 12 |
| 13 | Drain Electrode | Ti/Ni/Ti/Ag | 1/6/2/1KA | 13 |
| 14 | GaN Via Passivation | Silicon Nitride | 4-8KA | 14 |
| 15 | GaN Via Metal(s) | Ti seed / Ni Plating | 4-10um | 15 |

FIG. 29

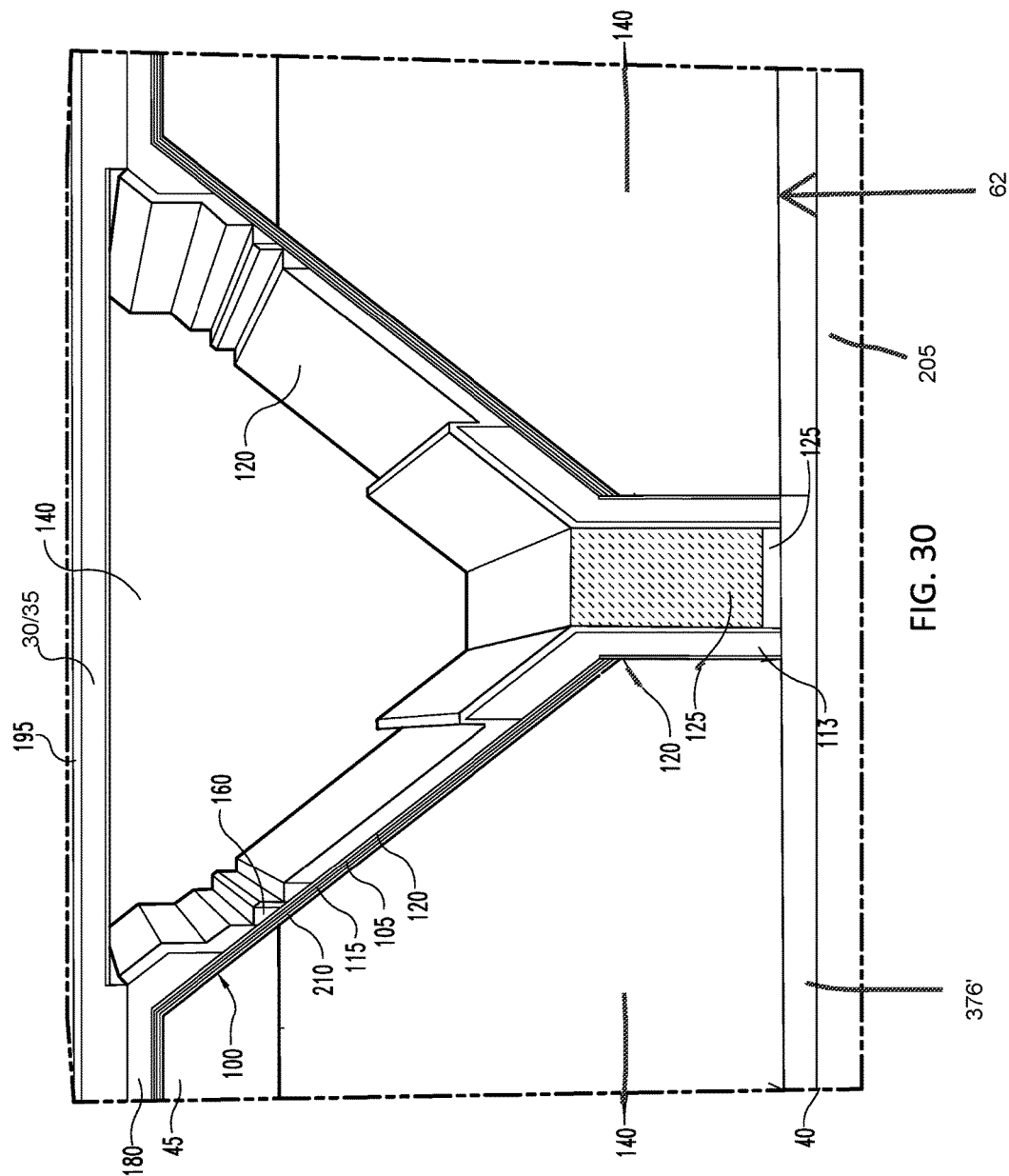

METHOD FOR PRODUCING TRENCH HIGH ELECTRON MOBILITY DEVICES

CROSS-REFERENCE TO RELATED APPLICATIONS

This utility patent is a continuation-in-part of co-pending U.S. patent application Ser. No. 14/307,222, filed on Jun. 17, 2014, which claimed priority to then U.S. provisional patent application Ser. No. 61/836,338, filed on Jun. 18, 2013; and then U.S. provisional patent application Nos. 61/858,850, filed on Jul. 26, 2013; 61/867,288, filed on Aug. 19, 2013; and Ser. No. 62/007,637, filed on Jun. 4, 2014, all of which are incorporated herein by reference.

TECHNICAL FIELD

The present invention relates generally to electronic devices, and, more particularly, to multi-layered High Electron Mobility Transistor (HEMT) devices and their method of manufacture.

BACKGROUND

For decades the world has enjoyed the advancements seen from the development, and production implementation of numerous III/V and II/VI compound semiconductors. The High Electron Mobility Transistor type is fabricated with, and makes use of a Two (2) Dimensional Electron Gas (2DEG), such as formed from an $Al_{(x)}Ga_{(1-x)}N/GaN$ heterojunction. Generally, to obtain high currents, and high frequency operation for a given semiconductor device, a high charge carrier mobility (u), along with a high saturation velocity ($v_{sat}$) needs to be developed by the transistor device structure. When reviewing the high electron mobility that GaAs (u~8,500 $cm^2/V*S$) based HEMT's offer, the carrier mobility clearly indicates the primary reason that HEMT device structures exhibit superior high-frequency performance. The mobility and saturation velocity of the aforementioned (2DEG) at the $Al_{(x)}Ga_{(1-x)}N/GaN$ heterojunction is shown at room temperature to be typically between 1,200 $cm^2/V*S$ and 2,000 $cm^2/V*S$, which is more than adequate for superior high-power and high-frequency transistor device operation. When reviewing the (2DEG) sheet charge density (ns) of the $Al_{(x)}Ga_{(1-x)}N/GaN$ structure again showing to be extremely high (~1e3/$cm^2$), due to the strong piezoelectric and spontaneous polarization induced effects. Where this heterojunction provides the ability for the design of high frequency, voltage, current, and conductance HEMT devices. Additionally, $In_{(x)}Ga_{(1-x)}N/GaN$ heterojunction compound semiconductor films are used to produce Multiple Quantum Wells (MQWs) to enhance recombination/generation of electron/hole pairs for the operation of typical light emitting diodes (LEDs), and photovoltaic cell devices (PCs). These devices have been fabricated in the horizontal or lateral plane of the semiconductor, and have resulted in device structures that have been refined and improved over the course of decades.

However, traditional HEMT devices still suffer from several drawbacks. While more thermally efficient than their predecessors, HEMT devices still suffer from limitations imposed by waste heat generated from power handling and their thermal dissipation rates, current handling capacity, channel width, tunneling, and various unwanted leakage currents. Thus, there is clearly a need for an improved HEMT device structure. Today's LED and photovoltaic cell devices can be limited in their light generation or absorption due to the fixed lateral surface area and plane of these typical device structures. Additionally, absorption losses within the bulk LED material(s), Fresnel losses, and critical angle losses, have shown through experimentation to be the major factors that prevent light generation. These locally generated photons through forward biased injection electroluminescence can be rejected/absorbed from having the opportunity of being externally illuminated from the device surface. Indicating a clear need for future semiconductor innovation, towards the development of additional compound semiconductor power, and optical device improvements. The present novel technology addresses these needs.

SUMMARY

The present novel technology relates to an improved HEMT design. One object of the present invention is to provide an improved HEMT device and method for its manufacture. Related objects and advantages of the present invention will be apparent from the following description.

FIGS. 1-31 graphically illustrate the manufacturing process for making a first embodiment compound semiconductor vertical or steep angle Trench High Electron Mobility Transistor (THEMT) device that includes an array of Two (2)-Dimensional Electron Gas (2DEG) trench structures of the present invention.

DETAILED DESCRIPTION OF THE PREFERRED EMBODIMENTS

For the purposes of promoting an understanding of the principles of the invention and presenting its currently understood best mode of operation, reference will now be made to the embodiments illustrated in the drawings and specific language will be used to describe the same. It will nevertheless be understood that no limitation of the scope of the invention is thereby intended, with such alterations and further modifications in the illustrated device and such further applications of the principles of the invention as illustrated therein being contemplated as would normally occur to one skilled in the art to which the invention relates.

Overview

In general, the present novel technology relates to the further advancement of GaN or like compound semiconductor devices formed on silicon substrates. Novel processing methods further exploit the GaN-type compound semiconductor. One or more single heterojunction(s) or multiple heterojunction(s) are formed on a silicon or like substrate, typically as one or more $Al_{(x)}Ga_{(1-x)}N/GaN$ structures, or structures and compositions similar thereto to generate and exploit a series of spontaneous and stress induced 2 Dimensional Electron Gases or (2DEGs), oriented parallel to the Si(111) plane(s).

Given a Hexagonal Wurtzite (WZ) or Cubic GaN crystal orientation and face termination scheme, the 2DEG may be fabricated along an etched silicon (111) face/surface structure. By use of this novel fabrication method, a 2DEG conduction path may be achieved along vertical or nearly vertical plane, grove, or trench structures.

The GaN 2DEG crystal orientation may then be engineered into the Si/GaN/AlGaN/GaN compound semiconductor device, or similar. By use of chemically controlled silicon etch planes and substrate orientation, a vertical or steep-angle Trench High Electron Mobility Transistor (THEMT) may be achieved (hereinafter 'vertical' for convenience). Such devices allow for significant improvement in electronic device performance for power, current, voltage, temperature, and switching speed. Further other technologies, such as sensors, accelerometers, integrated circuit design elements/devices, biomedical sensors may be developed using the novel fabrication method. In general, the novel technology gives rise to a host of devices that are stress and/or conductivity and/or polarization dependent. Magnetic properties may also be exploited in the crystal orientation properties related to an etched silicon or GaN substrate surface orientation.

The ability to perform bandgap engineering with InGaN over a range that provides a good solar spectral match to sunlight, makes $In_{(x)}Ga_{(1-x)}N/GaN$ suitable for Solar Photovoltaic Cells. It is possible to grow multiple layers with different bandgap energies, as the material is relatively insensitive to defects introduced by a lattice mismatch between the layers and substrate materials. A two-layer or multi-junction cell with bandgap of 1.1 eV and 1.7 eV can theoretically reach 50% maximum efficiency, and by depositing multiple layers tuned to a wide range of bandgap energies an efficiency up to 70% is theoretically expected.

Similarly, an $Al_{(x)}Ga_{(1-x)}N/GaN$ heterojunction structure, or structures and compositions similar thereto to generate and exploit a series of spontaneous and/or piezoelectric stress induced Two Dimensional Electron Gases (2DEGs) oriented parallel to the Si(111) plane. Given a Hexagonal Wurtzite (WZ) GaN crystal orientation and face termination scheme, the 2DEG may be fabricated along an etched silicon (111) profile/plane/surface structure. By use of this novel fabrication method, a (2DEG) conduction path, piezoelectric film, or Multiple Quantum Well, as example may be achieved along vertical or nearly vertical plane, grove, or trench structures.

The desired substrate crystal orientation for an $Al_{(x)}Ga_{(1-x)}N/GaN$ (2DEG) film structure, and/or $In_{(x)}Ga_{(1-x)}N/GaN$ (MQW) or like structures may then be engineered into various group III/nitride compound semiconductor devices. By use of chemically controlled silicon etch planes and substrate orientation, a vertical or steep-angle Trench High Electron Mobility Transistor may be achieved. Thus, allowing for significant improvement in electronic device performance for power, current, voltage, temperature, and switching speed. Further other technologies, such as Solar Photovoltaic Cells, Light Emitting Diodes, Laser Diodes, Laser elements, mechanical sensors, biomedical sensors, accelerometers, complex monolithic integrated circuit design elements/devices, may be developed using this novel fabrication method. In general, the novel technology gives rise to a host of devices that are piezoelectric stress and/or spontaneous conductivity and/or polarization dependent.

Additionally, device structures can have Photoluminescence, and/or Electroluminescence and/or Optoelectric properties which may also be exploited in the type III/nitride crystal properties related to an etched silicon or other etched substrate surface orientation.

FIGS. 1-30 illustrate a compound semiconductor vertical Trench High Electron Mobility Transistor (THEMT) 10, as well as related devices 10 built on this platform, and a method to produce the same that includes an array of Two-Dimensional Electron Gas (2DEG) trench structures 20, some including selectable transfer enhancement mode lateral DMOS silicon based structures 25, and including top-side Source and Gate contacts 30, 35, and a bottom-side or reverse side Drain contact 40 (see FIG. 1).

The typical substrate 45 starting material (see FIG. 2) is a uniformly doped $N^+$ type silicon, although other like semiconductive materials may be selected. More typically, the silicon substrate 45 is doped $N^+$ type silicon supporting an $N^-$ type lightly doped or undoped epitaxial silicon layer 50, and, if desired, also supporting a $N^+$ buffer layer 55. Alternately, combinations of P/N type silicon substrate 45, with or without N/P type epitaxial layer(s) 50, and/or $N^+/P^+$ buffer layer(s) 55 may also be selected as the substrate material. Substrate diameter and thickness may be selected based on manufacturing equipment requirements. The typical substrate orientation is Si(100), or Si(110), but other orientations may also be used. For example, a $P^+$ type substrate 45 supporting $N^-$ type epitaxial layer 50, and $N^+$ buffer layer 55, may be used to build an IGBT type power device. Unless otherwise indicated, discussion will focus on one exemplary embodiment device 10 having an $N/N^+$ type substrate Si(100) 45 with lightly doped $N^-$ epi 50, without limitation or exclusion of other device formats, such as an un-doped, or lightly Phosphorus doped $N^-$ type Prime Si(100) substrate 45 layer which may be exploited for TLED 10, TPC 10, or THEMT 10 with Vds≈1,000V. This example substrate material 45 allows for oxide growths, deposited films, etches, diffusions, ion implantations, inter-dielectrics, metal layers, or the like. Additionally, backside thinning of substrate, backside silicon etching, dielectric deposition, and/or metallization manufacturing processes may be employed. The process of optimal substrate 45 specifications is typically achieved through matrix lot runs and/or selective application of these factors.

An $N^+$ substrate 45 with a $N^+$ buffer layer 55 of about 1-3 um in thickness and a 70 um expitaxial intrinsic (or very lightly doped $N^-$ type), layer 50 yields up to $10^{18}/cm^3$ carriers which may be exploited may be produced for voltage transistors 10 (Vds)=50V-1,000V. The $N^+$ buffer layer 55 is typically used as an etch target region for the 2DEG layer Si(111) plane/surface, and also to be used as an ohmic contact region for the bottomside Drain connection 40. A very lightly doped $N^-$ type epitaxial region 50, along with the doping of the $P^+/P^-$ well of the silicon transfer LDMOS FET 25, are factors that help increase the breakdown voltage of the device 10. This example substrate material 45 allows for backside thinning of about 2-20 mils, backside dielectric(s), and backside metallization manufacturing processes. The process of optimal substrate 45, epitaxial 50, and buffer 55 specifications are typically achieved through matrix lot runs/selection of these general controlling factors.

Next, a field oxidation or nitridation step is typically performed to grow an oxide or nitride layer 60 atop the epitaxial layer 50. The oxide or nitride layer 60 is typically Silicon Dioxide ($SiO_2$), silicon nitride ($Si_3N_4$), or any suitable wet/dry dielectric material (see FIG. 3). The thickness of the oxide layer 60 can very from a few Angstroms to several microns. The oxide layer 60 is typically around 5K Angstroms or 0.5 microns in thickness. The dielectric layer 60 in this case is a layer of $SiO_2$.

Figure 4:
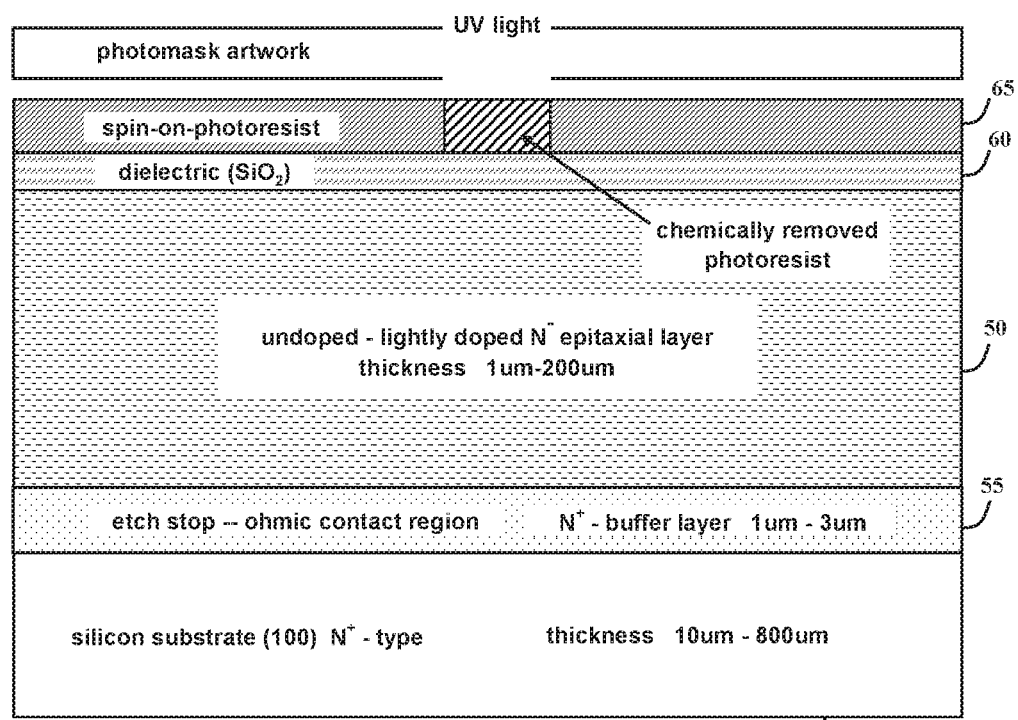

As seen in FIG. 4, a general photomask operation is typically next used to pattern a photosensitive material or resist layer 65. The photoresist layer 65 is typically spun atop the dielectric layer 60 on the substrate surface, and photolithography, or optical lithography/UV lithography is typically used to expose the underlying photoresist material 65. The unhardened photoresist material 65 is then chemically removed, defining a "negative photoresist pattern" having a predetermined shape. A similar technique can be employed using a positive bias photoresist, as is also standard to the Art if desired to facilitate the design.

Figure 5:
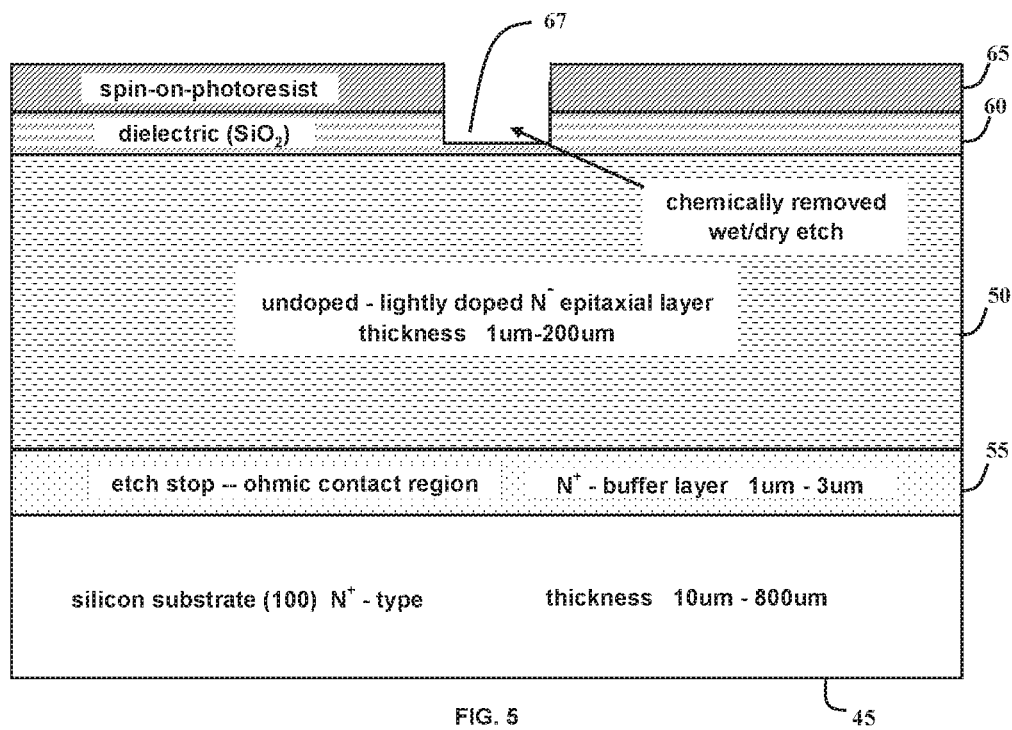

As illustrated in FIG. 5, the substrate is then selectively etched, such as by exposure to a wet or dry etch, which may completely remove or reduce in thickness the exposed dielectric layer 60 underlying the "negative photoresist pattern" and having the predetermined shape to define an exposed portion 67. In some cases the exposed dielectric 60 surface may not be etched before the next process operation, having the hardened patterned photoresist also acting as the barrier to the next process.

Figure 6:
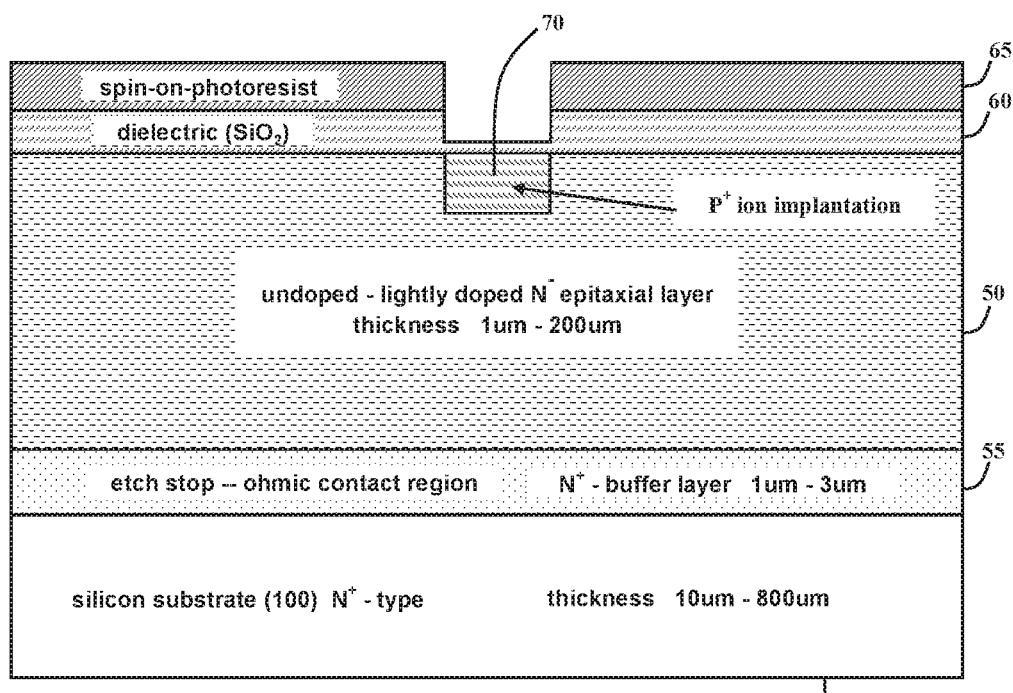
Figure 7:
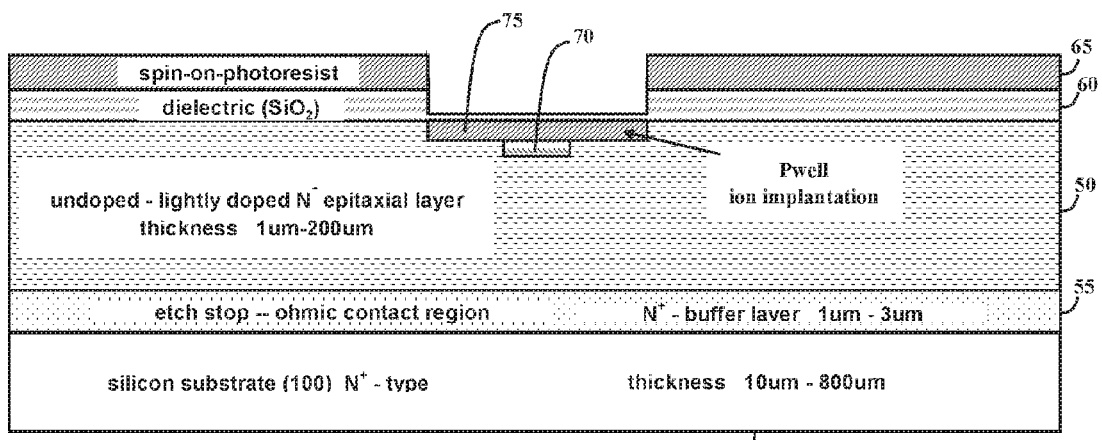
Figure 8A:
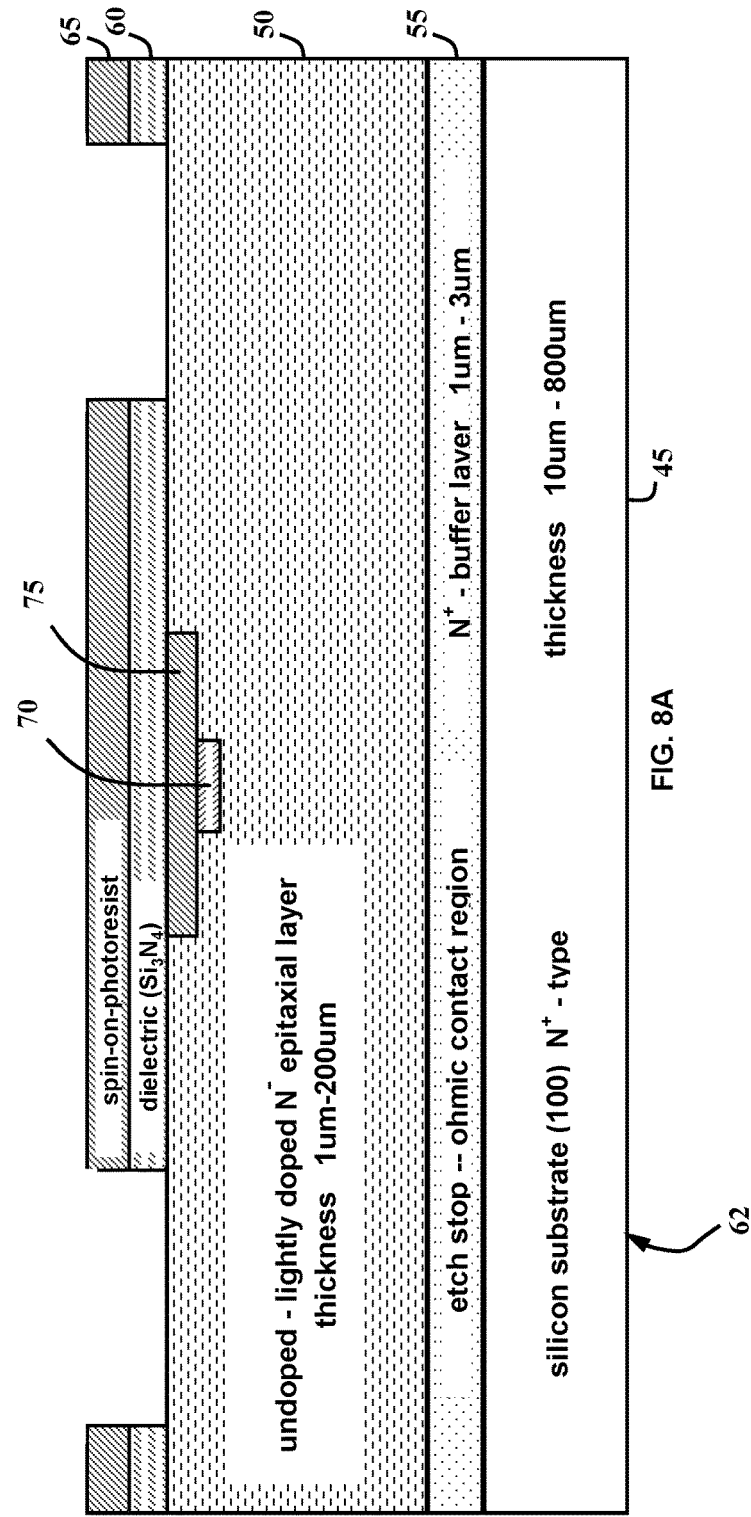
Figure 8B:
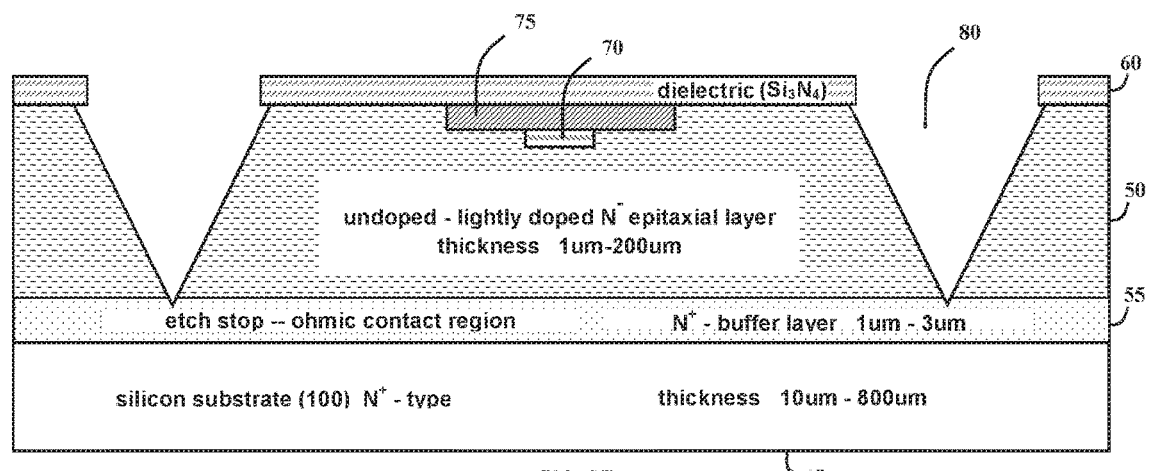
Figure 9:
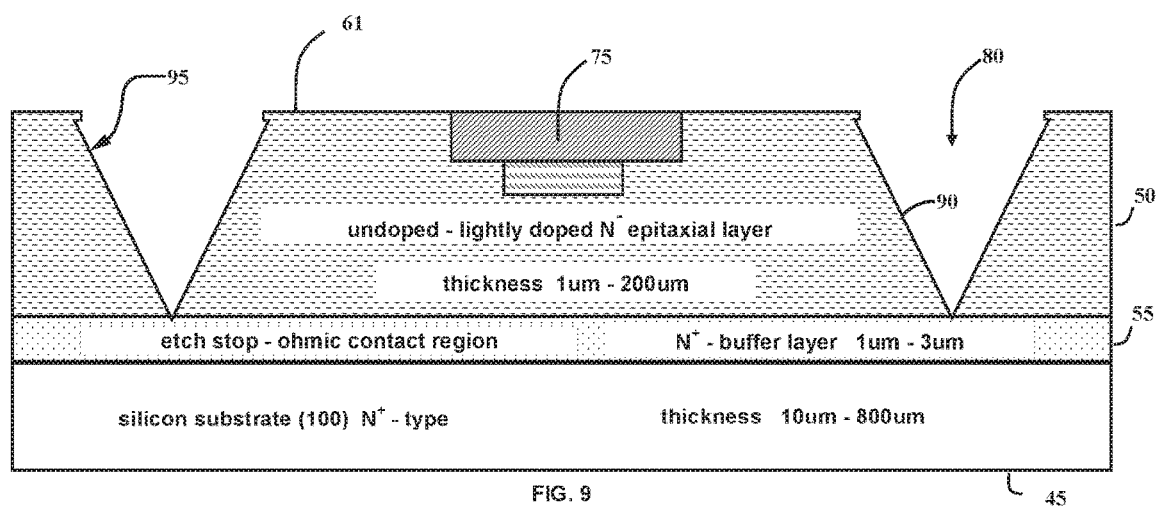

As illustrated in FIG. 6, the substrate 45 is then ion implanted/diffused as desired, in this example with a P$^+$ type dopant 70 such as boron and of a typical dosage level of about $10^{16}$-$10^{20}$ dopants per cm$^3$ to a typical depth of about 0.1-5 micrometers, depending on the desired transistor blocking voltage. The P type dopants 70 are provided to be additionally annealed or diffused, and/or can be left unactivated to out-diffuse during subsequent thermal operations, so as to provide an adequate electrical ground for thermally generated holes, and to help provide VDS/IDS reverse blocking capability for the transistor 10.

Next in the similar manner as above (see FIG. 7) the substrate is cleaned and prepared for a 2$^{nd}$ masking layer, by forming an additional 5KÅ layer of SiO$_2$, with masking of photoresist, and etching of exposed dielectric material to provide regions for a P$^-$ type ion implantation/diffusion is typically performed to generate a lightly doped P$^-$ layer 75. Typically a dopant density of about $10^{13}$-$10^{18}$ dopants per cm$^3$ to a depth of about 0.1-5.0 micrometers layer at the surface of the silicon is achieved to provide for an enhancement mode N-channel layer used to control the flow of electrons when the device 10 is on. This layer 75 typically outwardly diffuses during succeeding thermal operations as previously discussed. As can be seen the dielectric oxide, masking/etch operations, and ion implanting/thermal diffusions of various P/N type dopants can be repeated to define complex device types or process modules as desired standard to the Art of semiconductor manufacturing.

Next, a silicon trench etch surface substrate 45 is prepared for anisotropic silicon wet etching 80. In the similar manner as above (see FIG. 8A) the substrate is cleaned and prepared for a 3$^{rd}$ silicon hard etch masking layer. This is usually performed by forming an additional 5KÅ layer of Si$_3$N$_4$, or SiO$_2$ with masking of photoresist, and etching of exposed dielectric material to provide regions exposed for anisotropic silicon wet etching. This dielectric layer is photo-masked and dielectric etched to expose the underlying silicon material for this etching process 80, in this case the dielectric layer is Si$_3$N$_4$.

The Self-Limiting Stable Profile (SLSP) anisotropic silicon etch is typically a KOH/TMAH/EDP based etch, or similar Si(111) selective silicon etch 80. The anisotropic wet etching of silicon along the Si(111) Self-Limiting Stable Profiles is a well-established standard etch method. Etching a Si(100) surface through a 100 um rectangular hole using a SLSP designed photo-mask, for example, a rectangular hole in a layer of silicon nitride typically creates an inverted trapezoidal pyramidal shaped etch pit with flat sloping Si(111) oriented sidewalls and a flat Si(100) oriented bottom. The Si(111) oriented sidewalls typically have an angle to the surface of $\tan^{-1}\sqrt{2}=54.7°$. If the etching is continued until the flat bottom disappears, the SLSP shapes/surfaces becomes a SLSP inverted trapezoidal trench with a Si(111) surface V-shaped cross section. If the original rectangle was a 100 um perfect square, the initial shape when etched to completion enjoys a SLSP inverted pyramidal shape of about 70 um deep (see FIG. 8B).

When etching the Self-Limiting Stable Profile Si(111) planes, in the presence of a P type dopant, such as Boron, will greatly reduce the etch rate, and may prevent etching all together. This etch behavior may be used to facilitate the design as in the case with AlGaN/GaN piezoelectric biosensors, or force sensing elements related to compression/strain/shear, or etch stop protection during wet etching as examples. Etch rates are generally developed and optimized for surface roughness, and etch precision through experimentation, and process matrix selection standard to the art of micro-electro-mechanical structures fabricated in silicon.

Typically, the substrate 45 is next stripped of the hard dielectric masking material (i.e., silicon nitride, Low Temperature Oxide film (LTO), or similar) such as by use of plasma etching, wet etching, or the like. The substrate 45 is then stripped of any additional native oxides or surface contaminates to provide a clean, smooth etched surface for Metal Organic Chemical Vapor Deposition (MOCVD) or like process. In some cases, the dielectric/oxide layer may not be stripped or partially etched to provide for a method to selectively mask or prevent compound semiconductor film growth as desired. Additionally, heating to 1,000° C.-1,100° C. can be used or budgeted to help thermally diffuse the dopants 70 towards the edges of the silicon etched Si(111) planes 90 filling out the top surface 61 if desired, and to 0.1-10 micrometers below the top surface 61 of the silicon substrate 45 as needed depending on the desired VDS breakdown requirements. This is when the major thermal budget for the P$^-$ type well, and P$^+$ type grounding structures/diffusion are performed. The substrate 45 is then stripped of any native oxides or surface contaminates to provide a clean etched surface 95 for Metal Organic Chemical Vapor Deposition (MOCVD), or similar deposition technique (see FIG. 9).

Next after substrate cleaning, the substrate material is then MOCVD deposited with various III/nitride high temperature films to form the 2DEG regions. Other methods may include any method known or unknown future developed techniques appropriate for the material to be deposited including but are not limited to, chemical vapor deposition (CVD), low-pressure CVD (LPCVD), plasma-enhanced CVD (PECVD), semi-atmosphere CVD (SACVD) and high density plasma CVD (HDPCVD), hydride vapor phase epitaxial (HVPE), rapid thermal CVD (RTCVD), remote processing CVD (RPCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitration, spin-on methods, physical vapor deposition (PVD), atomic layer deposition (ALD), chemical oxidation, molecular beam epitaxy (MBE), plating, evaporation or like processes/tools/methods. It should be appreciated that many different processes/tools methods may be used, by which a compound semiconductor material 43 and/or other film can be grown or deposited on an etched Si substrate or like substrate material (see FIG. 10). These film structures would include, but are not limited to: nucleation layer(s), stress relief buffer layer(s), defect reduction layer(s), and bulk layer(s) composed of AlN, Al$_2$O$_3$, GaN, AlGaN, InGaN, TiO, GaAs, ZnO, SiC, or like compounds.

Nucleation layers that can be formed over etched silicon substrate include aluminum nitride (AlN), silicon nitride (Si$_3$N$_4$), silicon carbide (SiC), rare earth oxide (REO), AlGaN, GaN, ZnO, or Al$_2$O$_3$ as example. An etched substrate may include a number of materials, including Si, Ge, Ga, SiC, and those consisting essentially of one or more III-V compound semiconductors having a composition defined by the formula $Al_{X1}Ga_{X2}In_{X3}As_{X4}P_{X5}N_{X6}Sb_{X7}$, where $X_1$, $X_2$, $X_3$, $X_4$, $X_5$, $X_6$, and $X_7$ represent relative proportions, each greater than or equal to zero and sum=1 (1 being the total relative mole quantity). Other materials include II-VI compound semiconductors having a composition $Zn_{X1}Cd_{X2}Se_{X3}Te_{X4}$ where $X_1$, $X_2$, $X_3$, and $X_4$ represent relative proportions, each greater than or equal to zero and sum=1 (1 being the total relative mole quantity). In addition, an etched substrate may be doped with either an N type impurity and/or P type impurity in a conventional manner. As example N type silicon dopants may include but are not limited to: Phosphorous (P), Arsenic (As), Antimony (Sb), while P type silicon dopants may include but are not limited to: Boron (B), Indium (In) and Gallium (Ga). Single-phased Ge, Si, Ga, or like semiconductors, and/or $SiO_2$, $Si_3N_4$, AlN, or like layers to reduce defect density, or film stress and/or multiple quantum wells (MQWs), such as $In_{(x)}Ga_{(1-x)}N$/GaN, for additional photon emission, frequency control, and the like.

Figure 10:
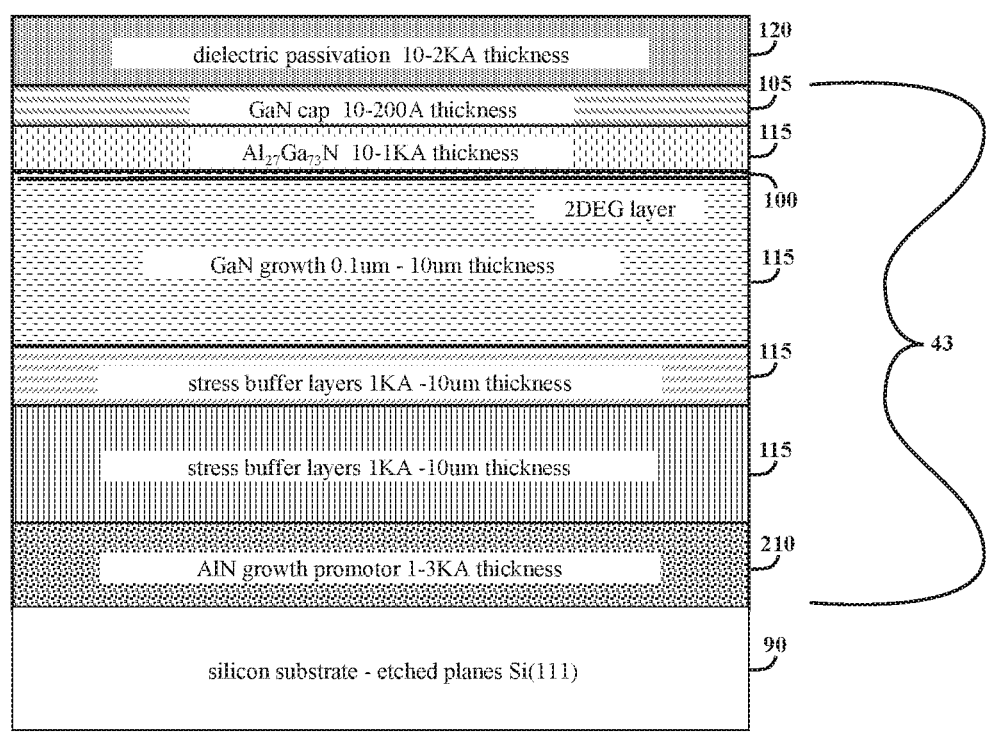

As shown in FIG. 10, high conductivity/mobility 2DEGs, high electron mobility layers or sheets 100 along the Si(111) trench plane/surface are created. The 2DEGs 100 are formed when the Ga face, or N faced GaN and AlGaN layers are formed on the Si(111) plane as etched. For example, as layers of first $Al_2O_3$(10 Å-100 Å) and/or, AlN (1KÅ-3KÅ) growth promoter 210, AlN and/or $Al_{(x)}Ga_{(1-x)}N$ and/or GaN stress buffer layer(s) (1KÅ-10 um) 115, 2DEG(s): GaN (1KÅ-15 um) 115, $Al_{(27)}Ga_{(73)}N$ (10 Å-1KÅ) 115, with GaN cap layer (10-200 Å) 105 are deposited, such as by MOCVD, one or more 2DEGs 100 then arise in the top 20 Å-2KÅ of the surface film structure.

Figure 11:
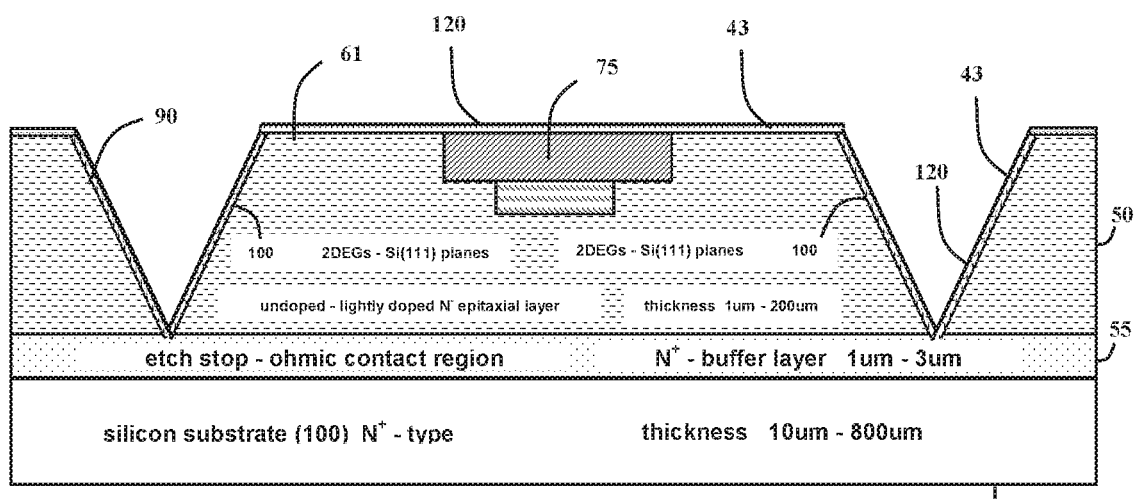
Figure 12:
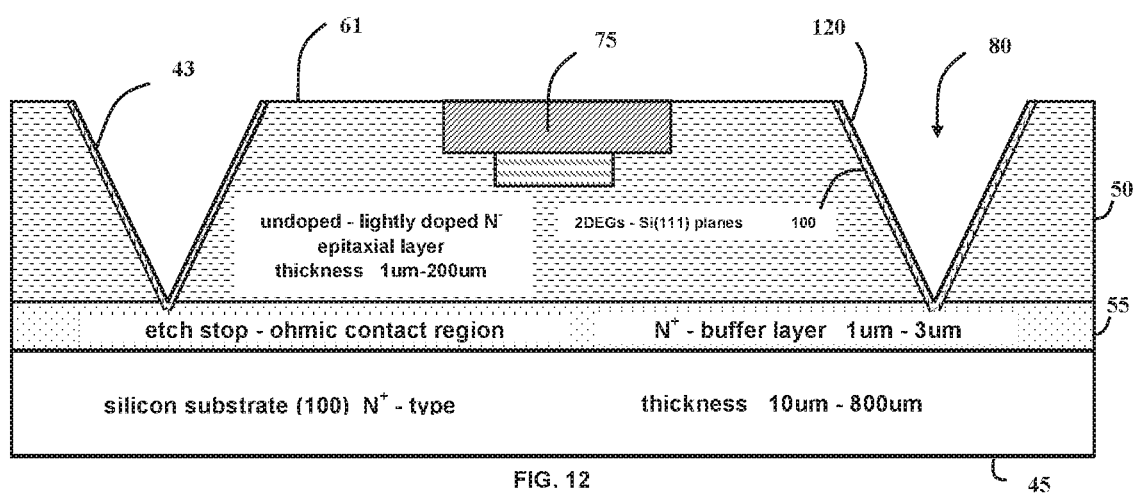
Figure 13:
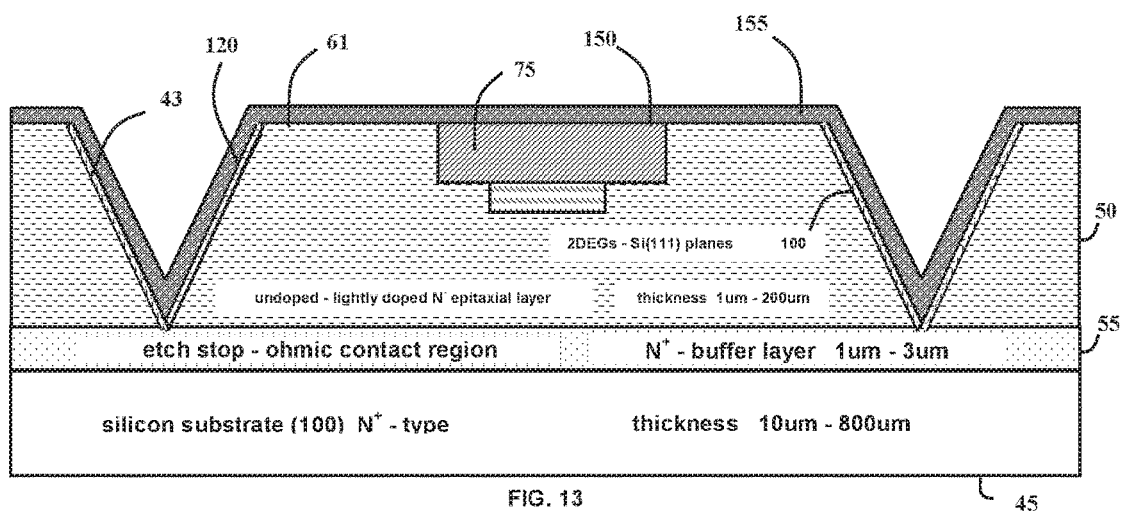
Figure 14:
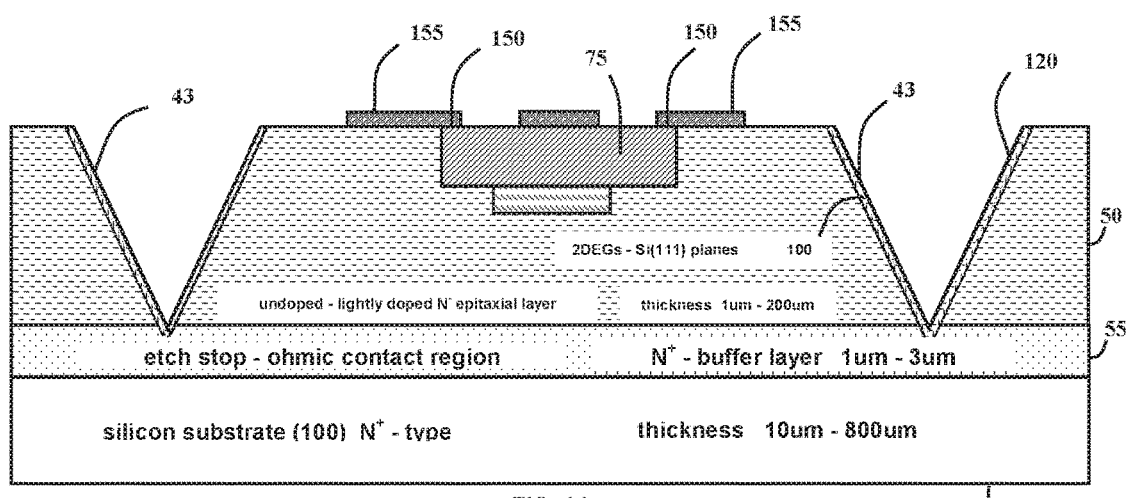
Figure 15:
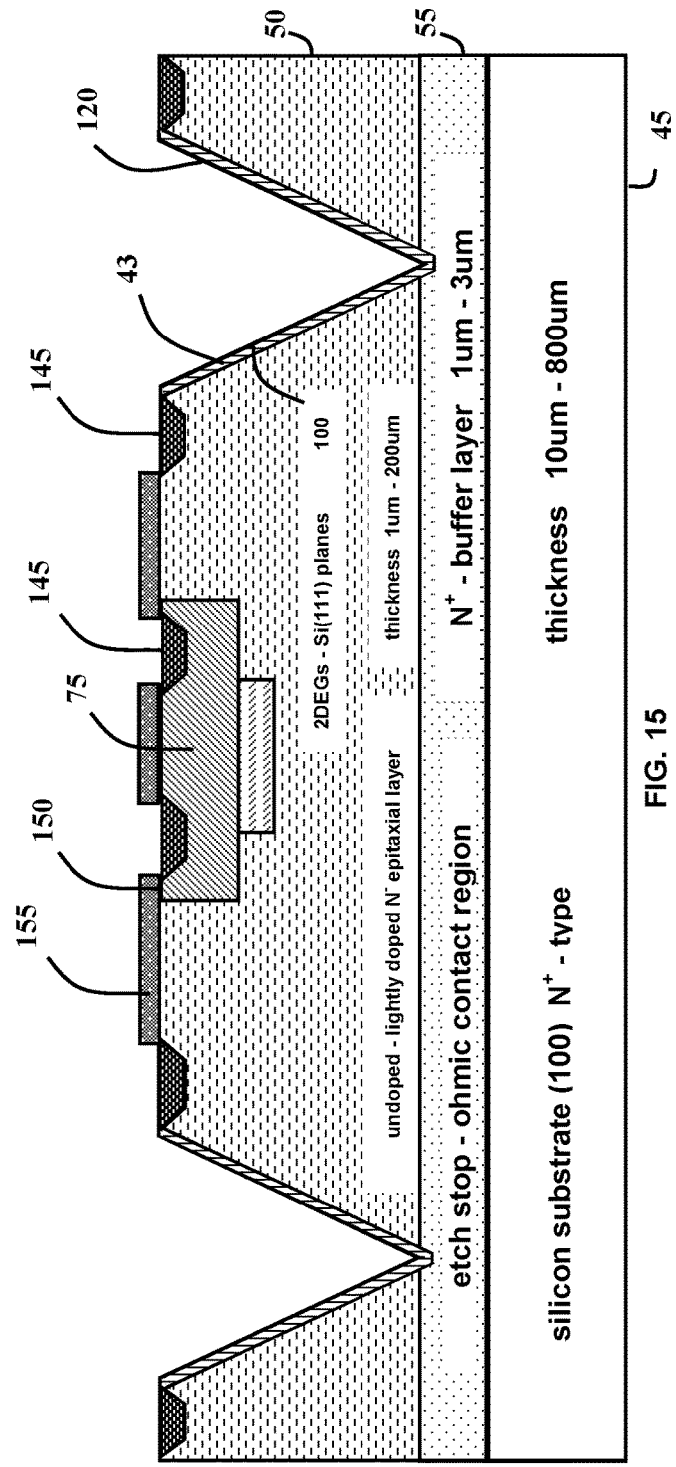
Figure 16:
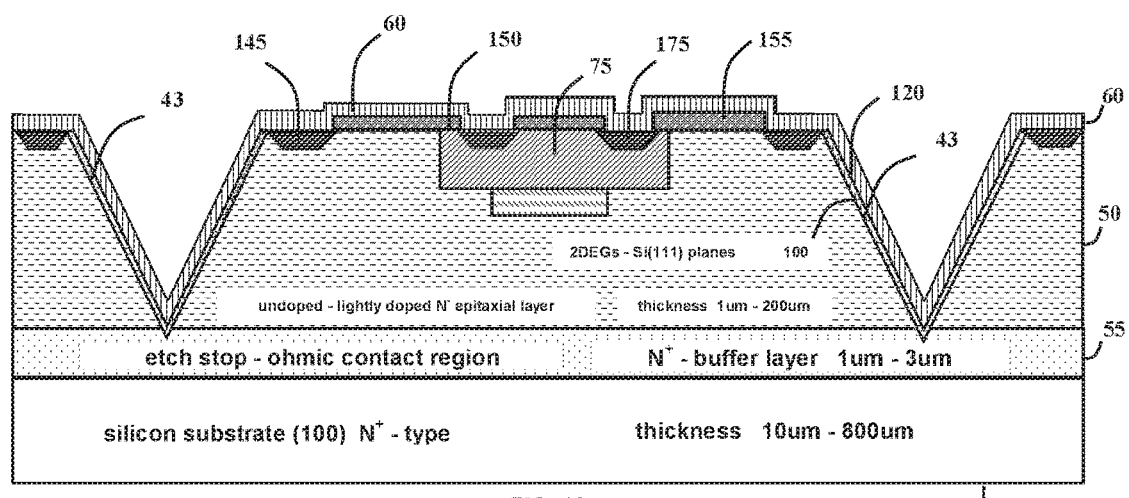
Figure 17:
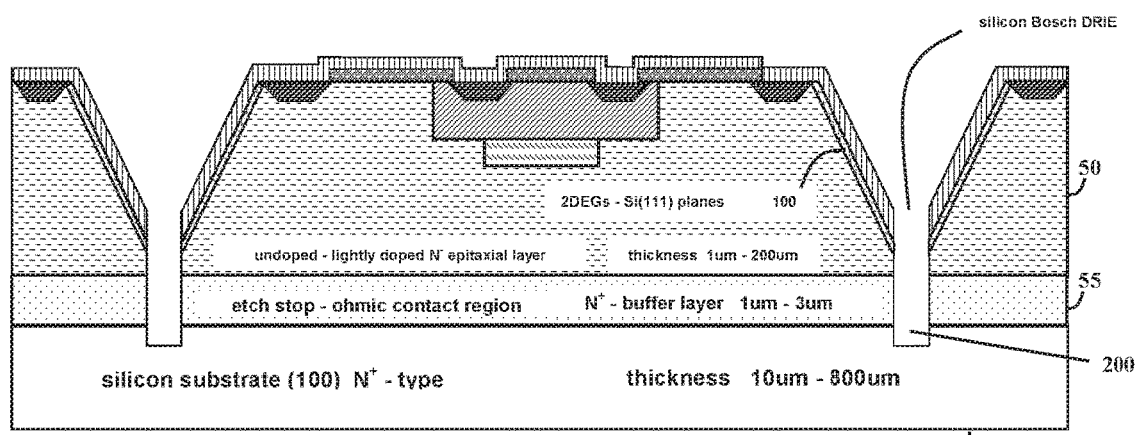
Figure 18:
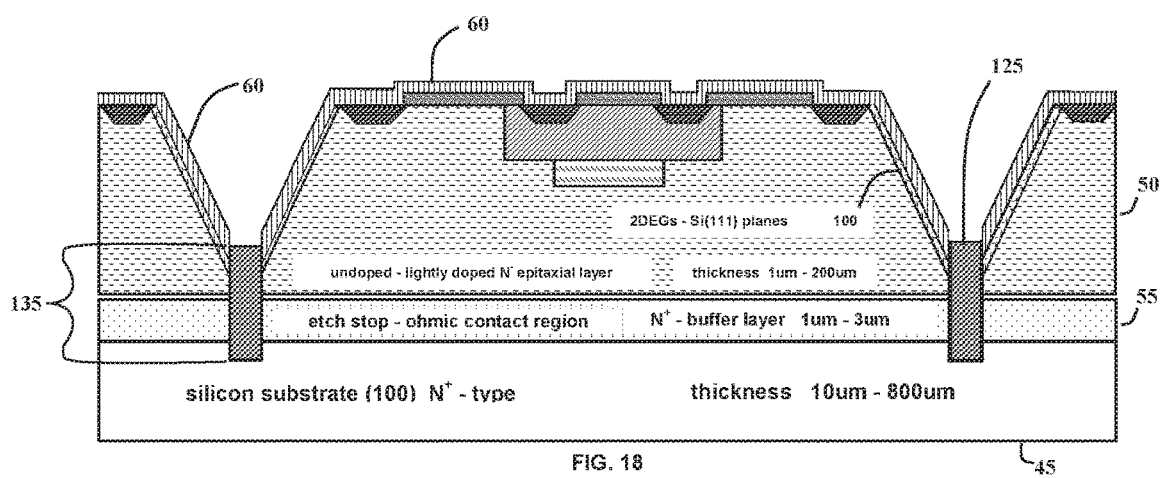
Figure 19:
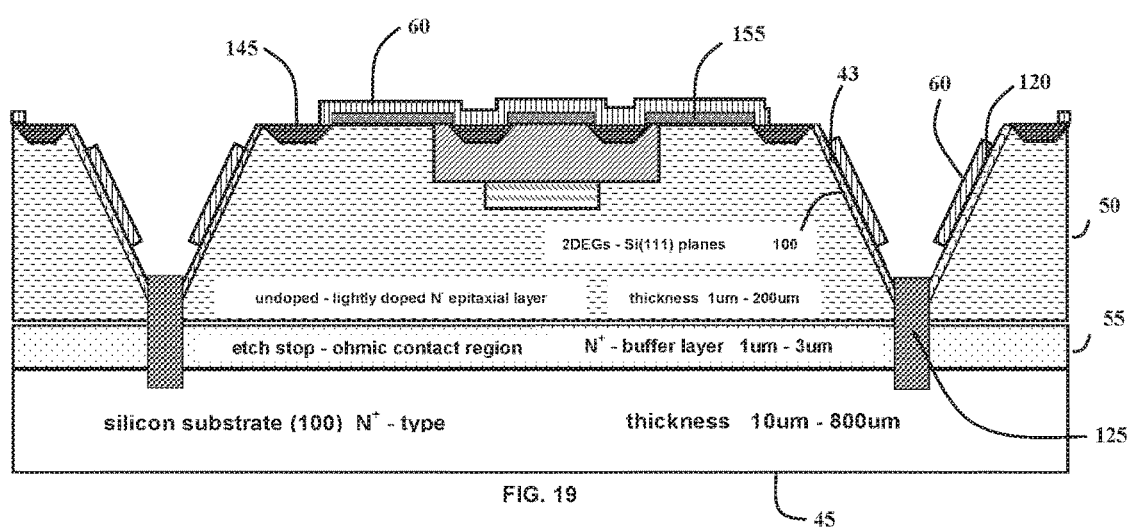
Figure 20:
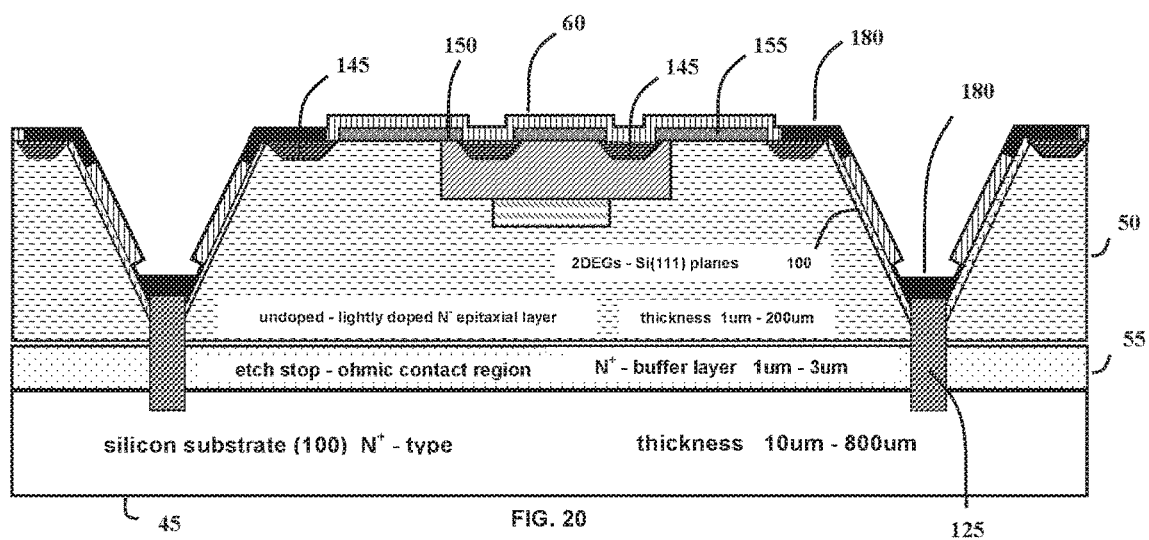
Figure 21:
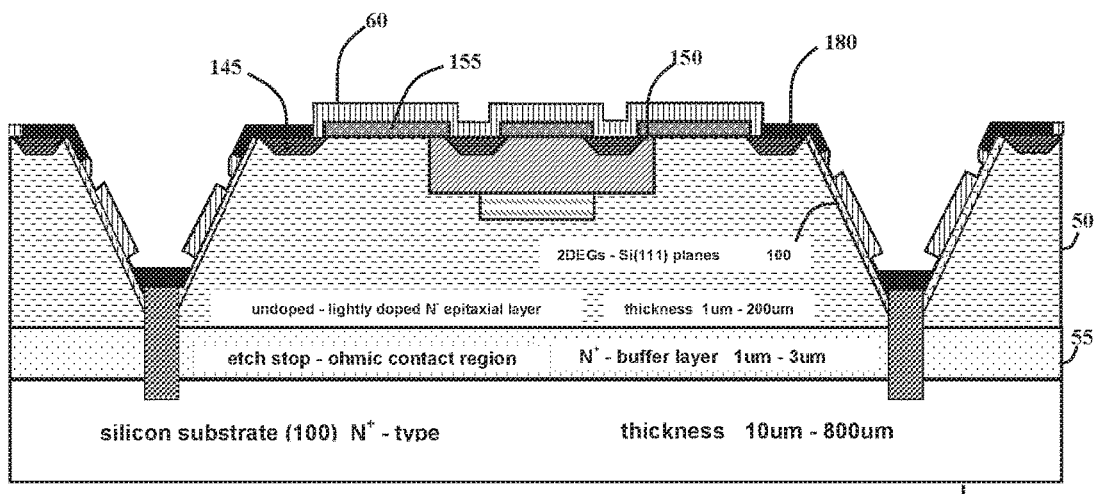
Figure 22:
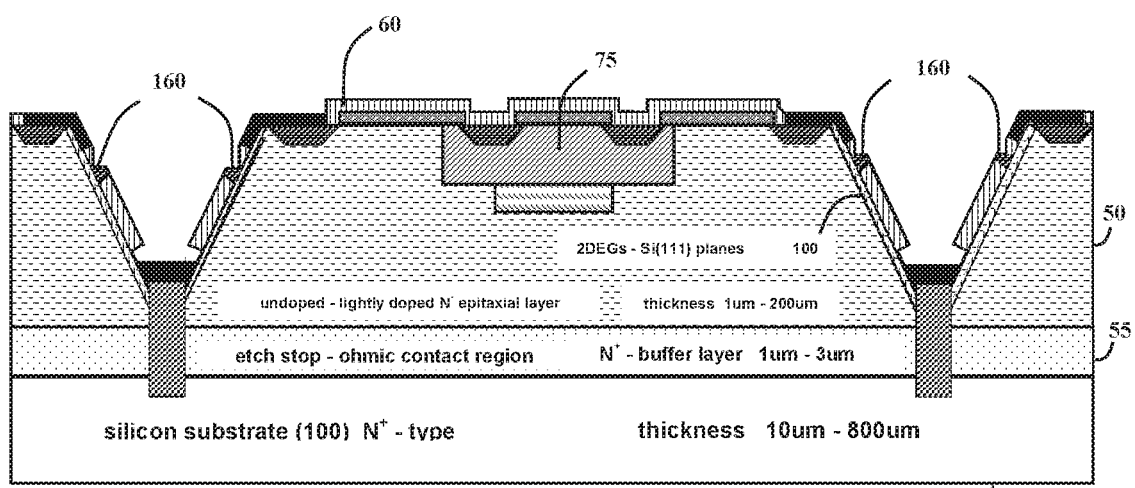
Figure 23:
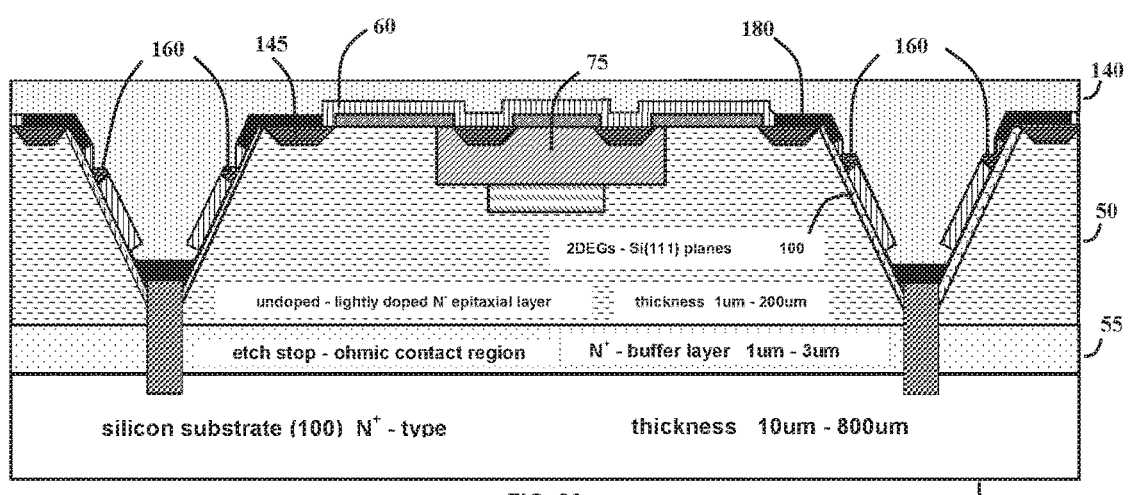
Figure 24:
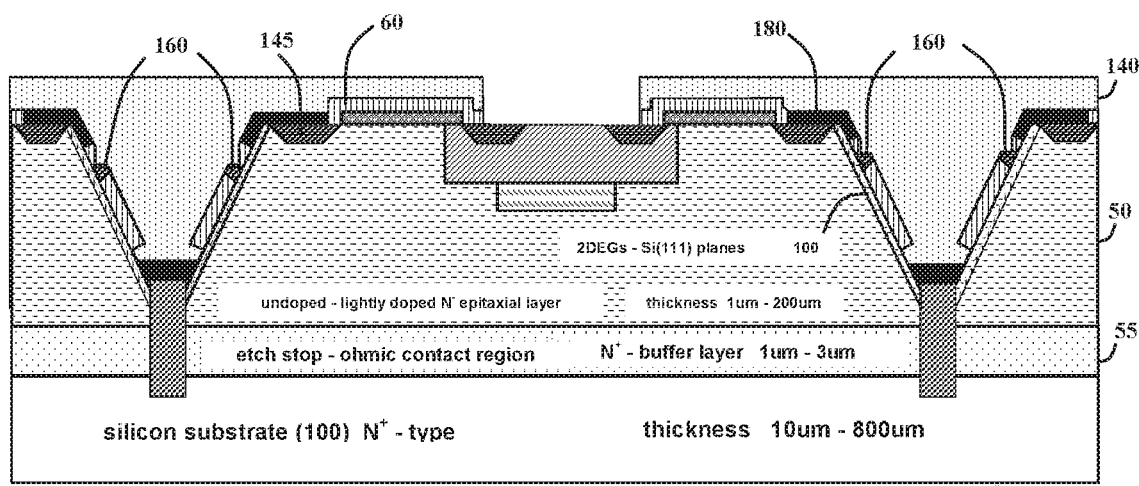
Figure 25:
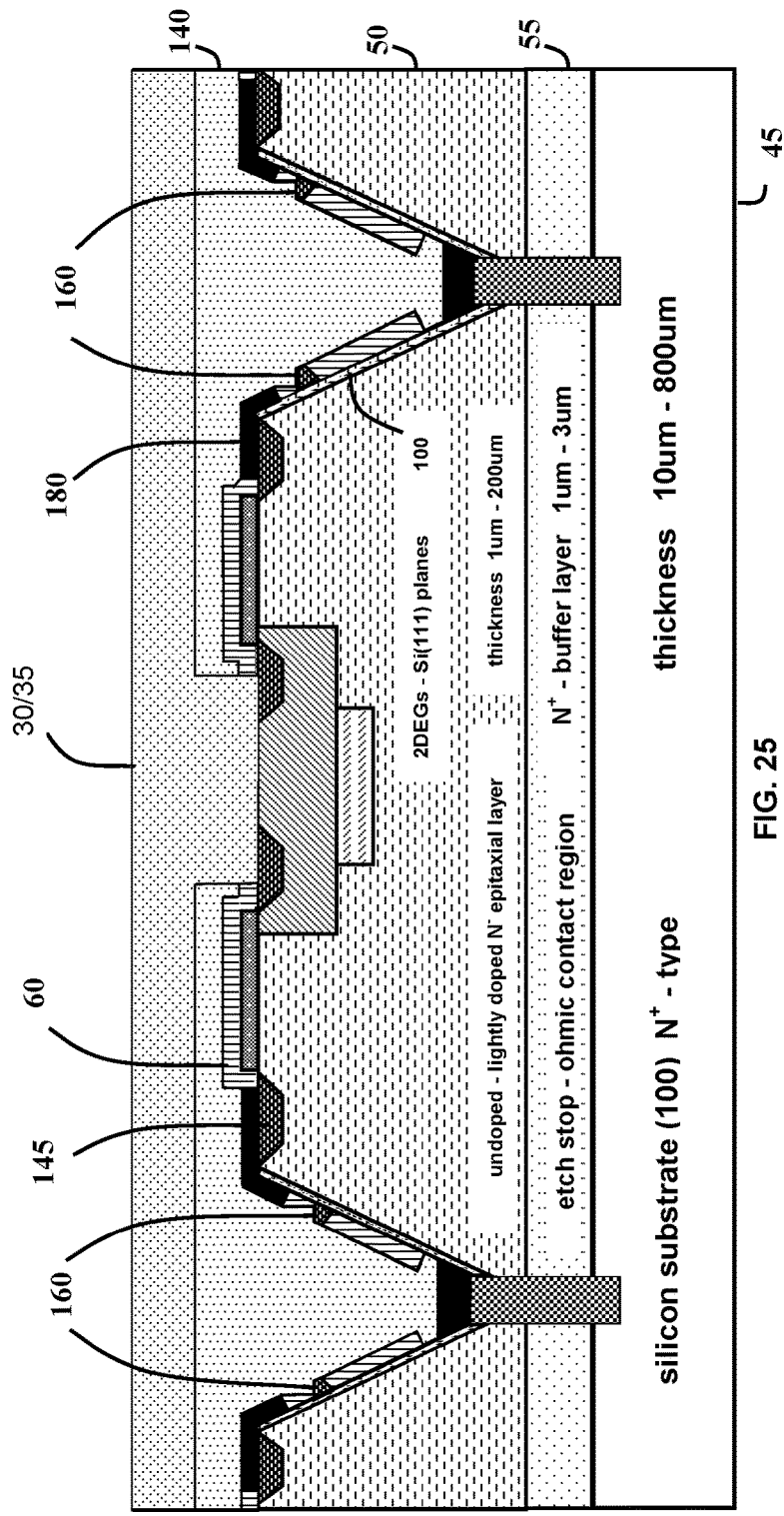
Figure 26:
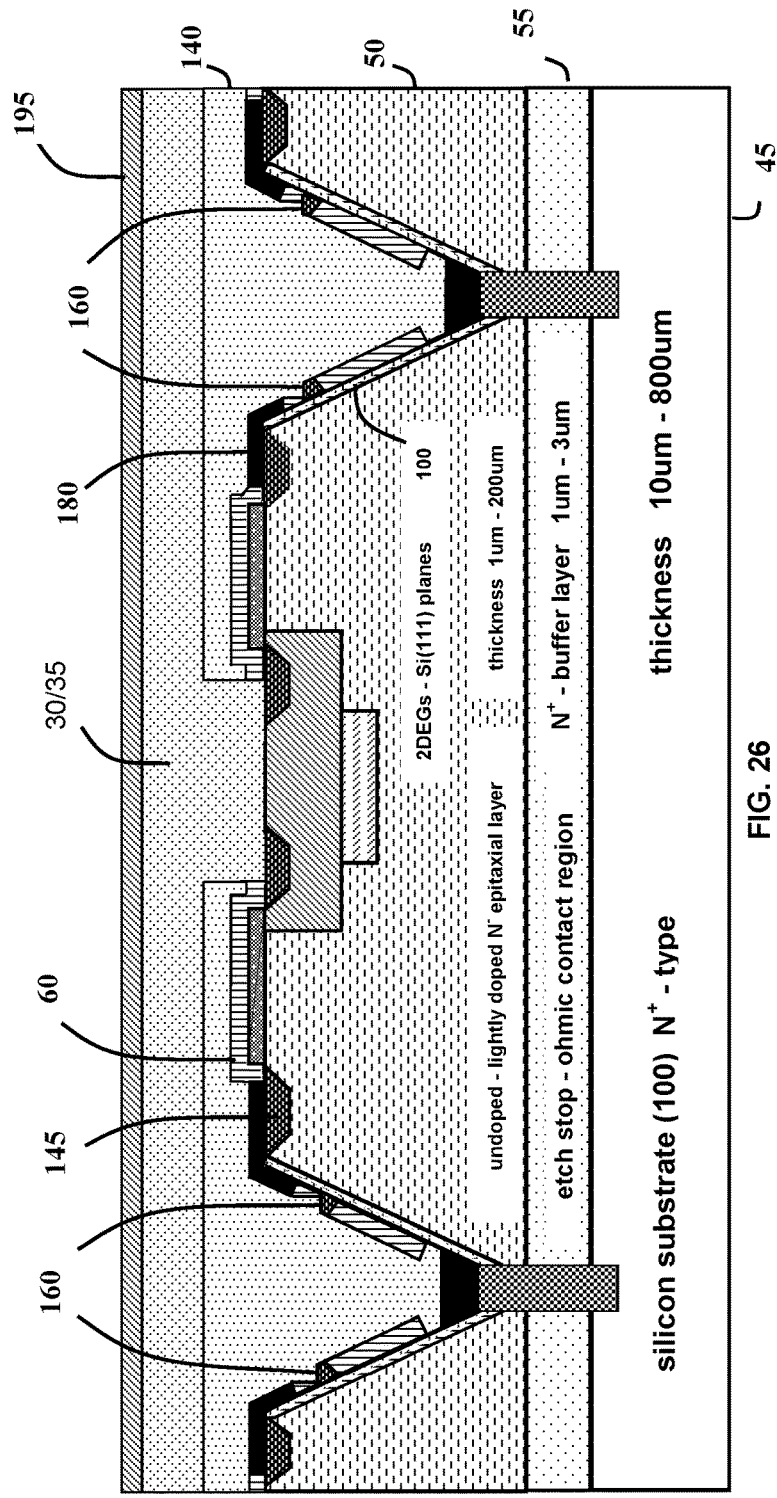
Figure 27:
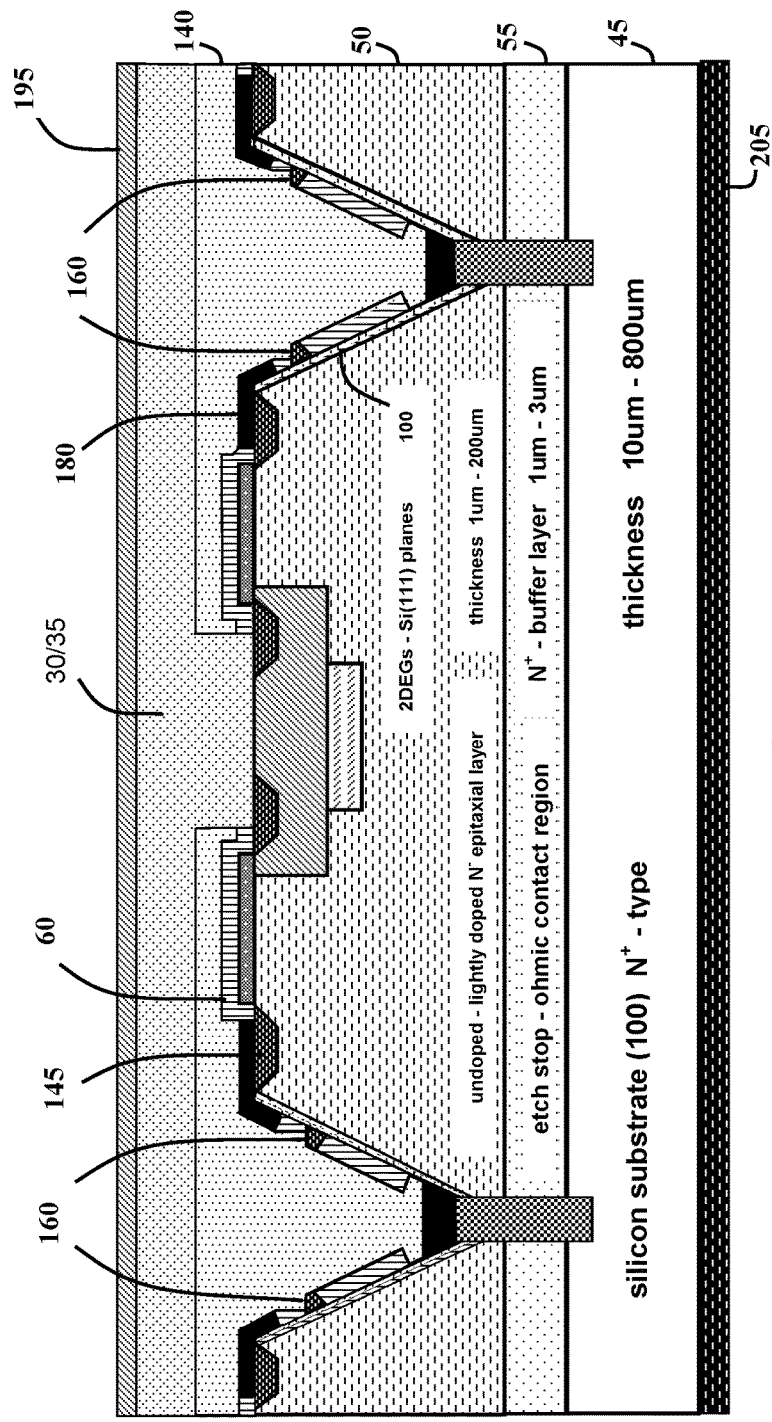
Figure 28A:
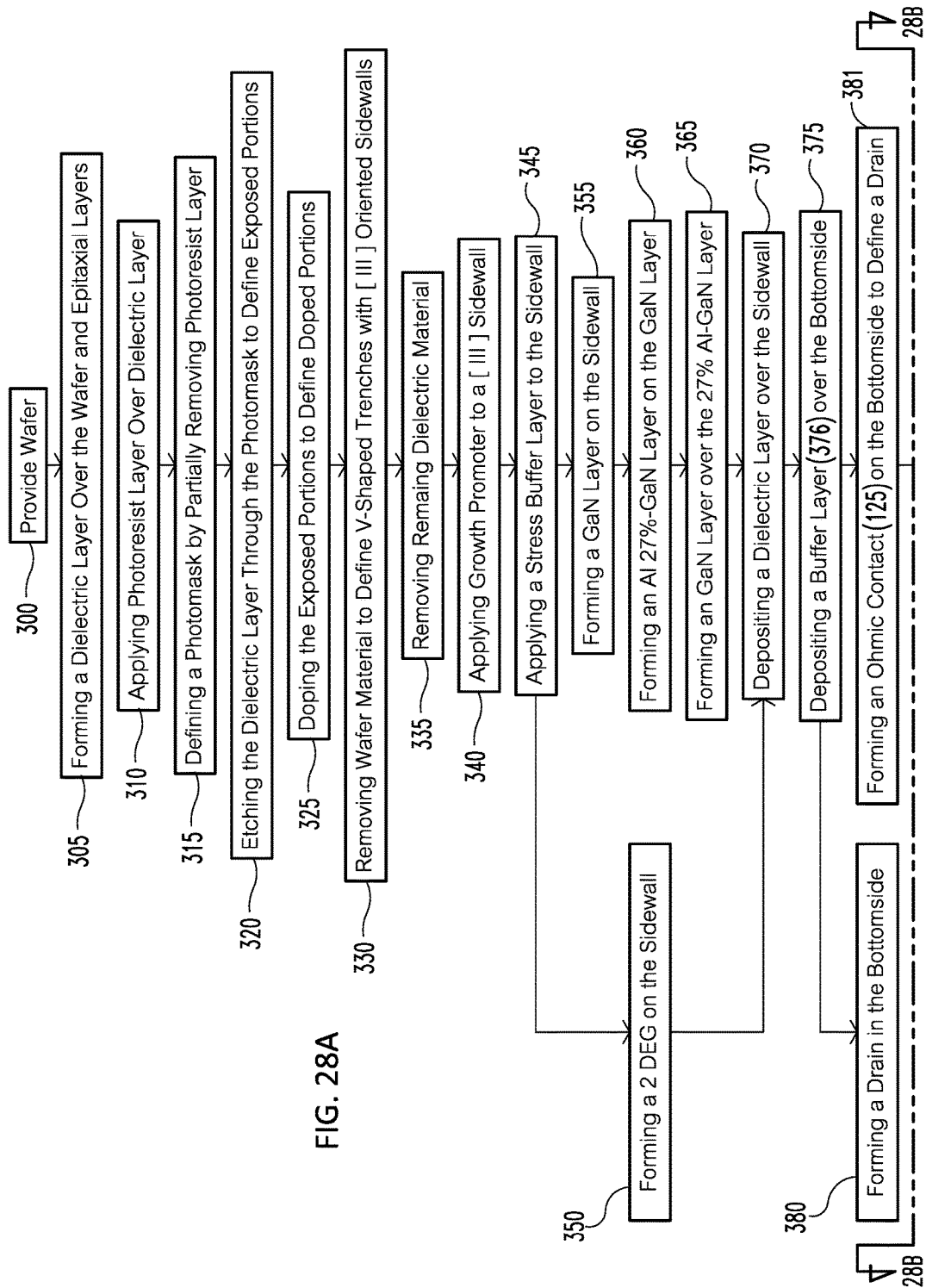
Figure 28B:
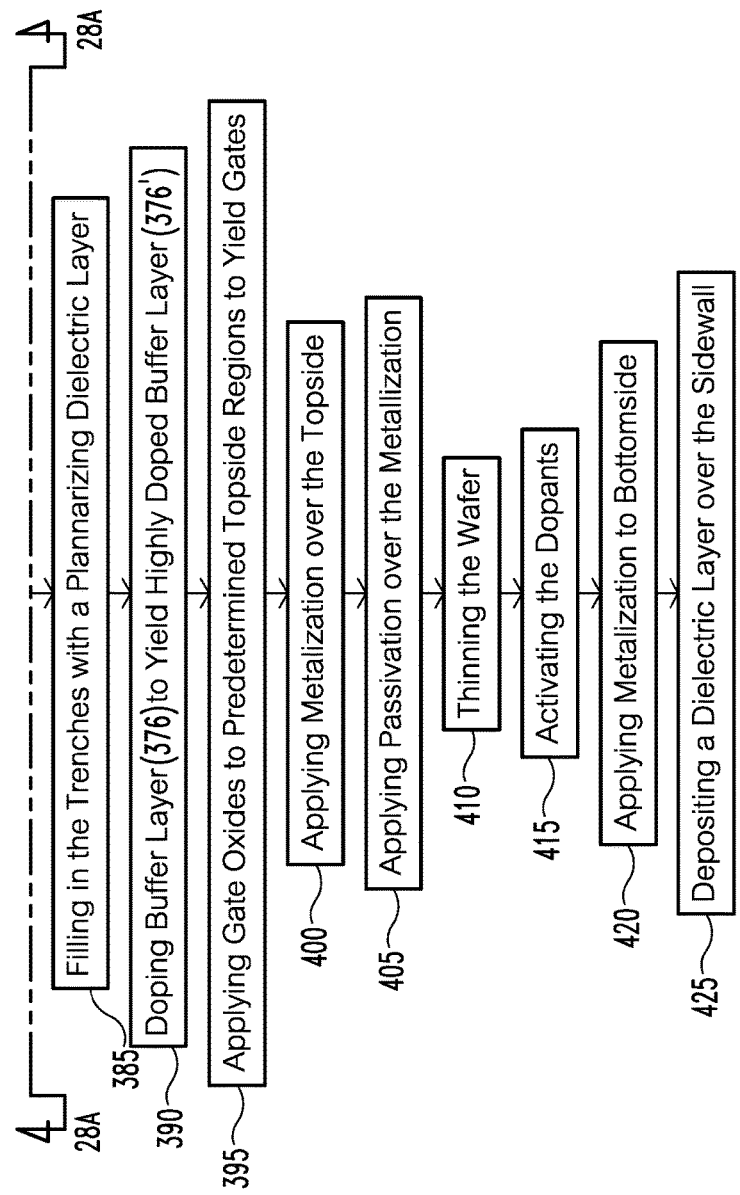
Figure 31A:
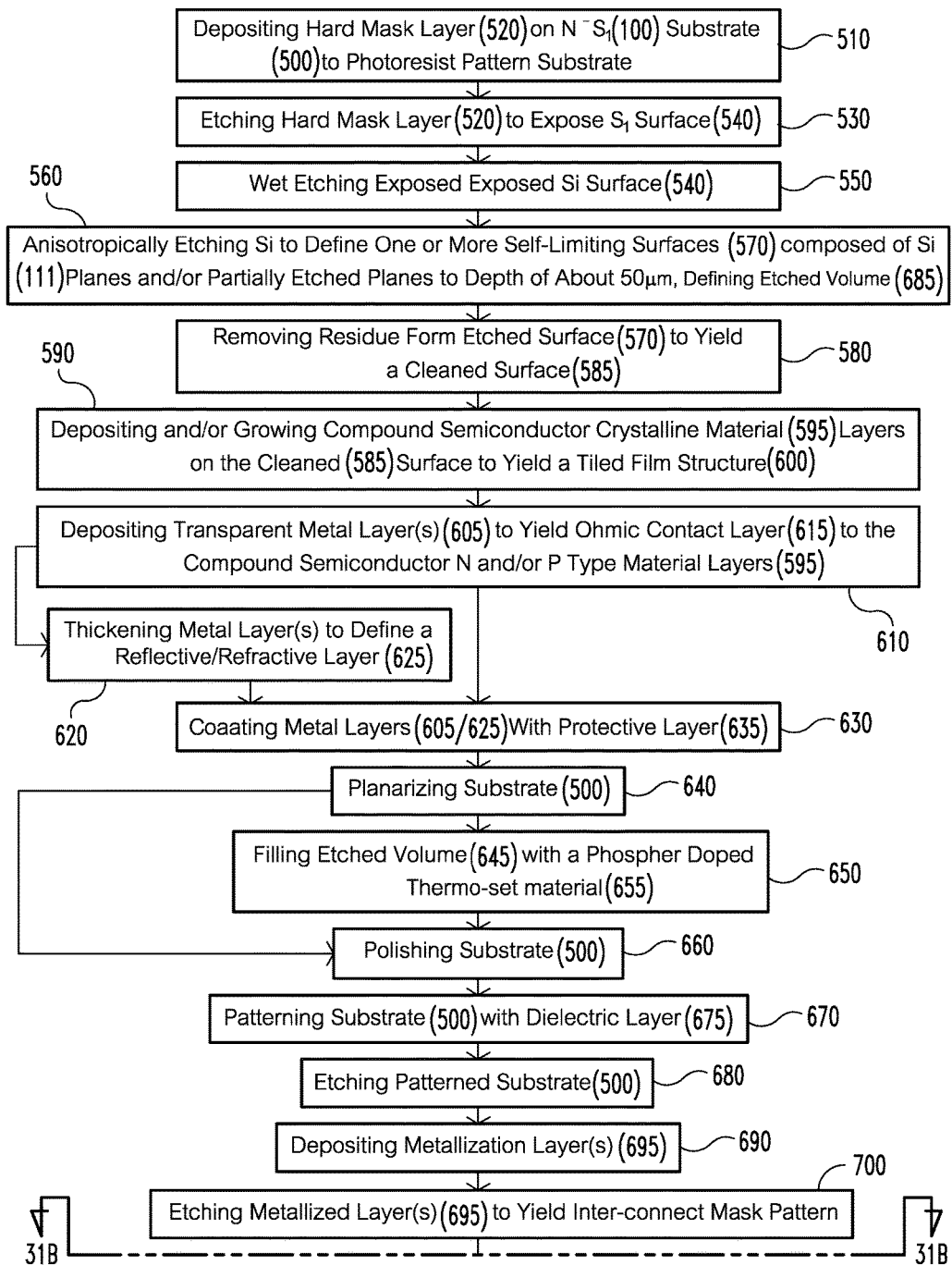
Figure 31B:
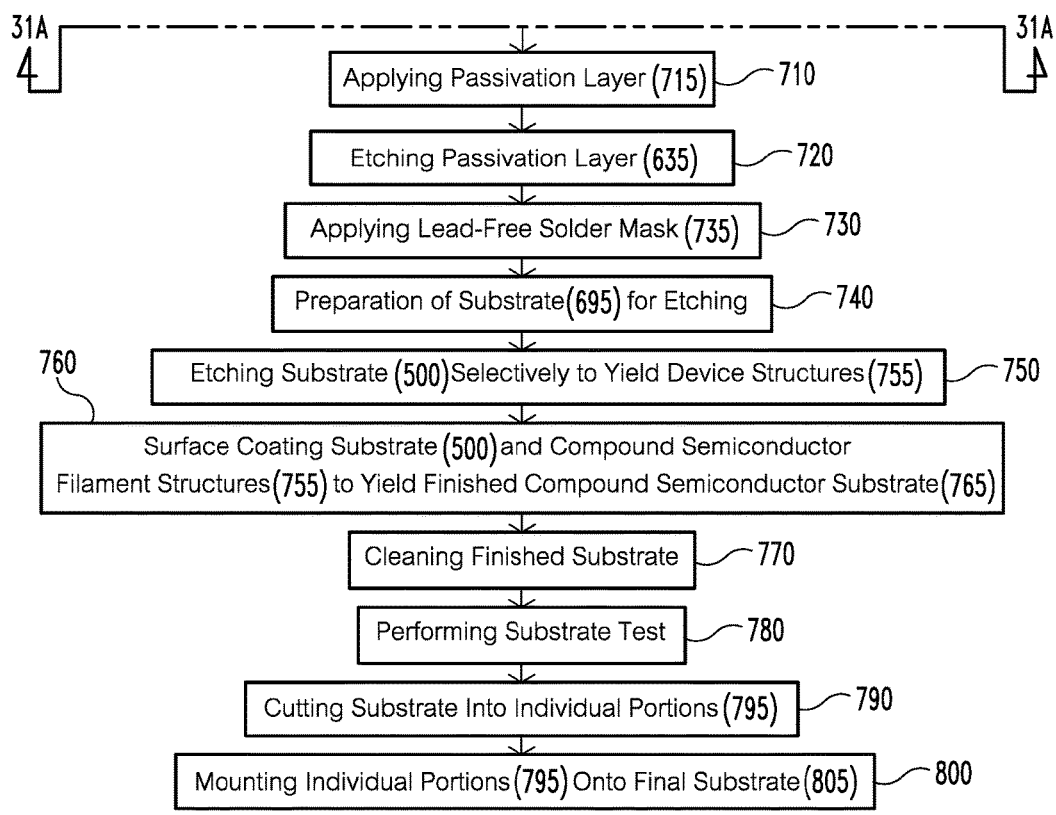

Typically, a protective silicon nitride ($Si_3N_4$) and/or $Al_2O_3$ or similar films 120 is next deposited (100 Å-4,000 Å) to enhance 2DEG performance (FIG. 11). In this example case a $Si_3N_4$ film 120 and 2DEG film stacks are then selectively Deep Reactive Ion Etched (DRIE) to create a Gate mesa masking region using a $4^{th}$ standard photomasking operation. Standard etch methods are used to etch the 2DEG passivation, followed by dry $Cl_2/BCl_3$ GaN based etch methods to expose the underlying silicon defining the transfer lateral DMOS transistor Gate structure regions (see FIG. 12). Next, about 500 Å-1,000 Å of Gate oxide 150, and about 8,000 Å of poly Gate material 155 are typically applied to the substrate surface 61. The Gate oxide 150 and/or poly Gate material 155 are applied to define the enhancement mode ($V_{TH}$>0 v) Gate controlling electrode 160 using standard processing methods (FIG. 13). Next, a $5^{th}$ masking layer is used to define, an $N^+$ type implantation/diffusion, which is performed to generate a highly doped $N^+$ layer regions 145. Typically, a dopant density of about $10^{19}$-$10^{20}$ dopants per $cm^3$ to a depth of about 0.1-3 micrometers regions is achieved to define the Source/Drain $N^+$ Ion Implant regions for the transfer LDMOS FET structure. This is typically performed by wet and/or dry etching of the Polysilicon Gate, and Gate Oxide material layers (see FIG. 14), followed by shallow $N^+$ ion implantation, and thermal activation of dopants (see FIG. 15). Next, a Low Temperature Oxide (LTO), or other suitable dielectric film, 60 is typically applied to insulate the poly Gate material 155 (see FIG. 16). This dielectric material 60 is about 0.8 um-1.5 um in thickness. Next a $6^{th}$ masking operation is performed to define the buried Drain via regions (see FIG. 17). Wet and/or dry etches are used to etch the topside dielectrics and 2DEG passivation exposing the 2DEG GaN films, then followed by $Cl_2/BCl_3$ DRIE for GaN films followed by silicon Bosch DRIE 200 to a depth of 5-30 ums as desired. The Drain vias are then followed by standard Ni plating using seed photoresist, or similar methods (see FIG. 18).

In this example the Drain metal vias 113 are fabricated using standard Ti seed layer, and Ni plating operations to form ohmic contacts to the $N^-$ epi 50 and/or $N^+$ buffer layer 55, and 2DEG Drain connection region 135. If desired a $N^+$ ion implantation can be incorporated before via metal 113 deposition to provide for enhanced ohmic contact region 125 from 2DEG 100 to the silicon material layers 50/55, and/or $N^+$ substrate 45 if desired. In some embodiments, the ohmic contact regions 125 are exposed for external connection through the top surface region 61 such as by being positioned as a topside sinker; in other embodiments the ohmic contact regions 125 are exposed for external connection through the bottomside 62 such as by connection through the vias 113; and in still other embodiments, the ohmic contact regions 125 are exposed for external connection via both the topside 61 and the bottomside 62.

After Drain via metal(s) formation, a separate $7^{th}$ masking operation can be employed to provide contact regions by exposing for etching: LTO, and 2DEG passivation layers. This $7^{th}$ masking operation is to provide for 2DEG Source, 2DEG Drain and Drain via ohmic connection region 135. Also, this same $7^{th}$ masking operation provides for LDMOS Drain inter-connection to HEMT Source 2DEG contact regions. Thus, providing low ohmic contact regions (see FIG. 19) for metal connections to buried Drain vias, topside HEMT Source, and LDMOS Drain inter-connection barrier metal(s). After contact etch formation, Ti/Al/Ni or similar metal(s) are deposited. Standard photoresist lift-off technique is employed to remove unwanted metal, followed by RTA of metal(s) as desired (see FIG. 20). An $8^{th}$ masking layer is used to disable the 2DEG films in the corner regions of the SLSPs to prevent unwanted leakage currents, and premature Vds breakdown. This ion implant typically makes use of one or more implant spies such as Nitrogen, Argon, or Iron. In this example case, Nitrogen implantation is used to disable the 2DEG conduction layer followed by RTA to activate the nitrogen dopants. Next to follow is a $9^{th}$ mask, used to pattern HEMT Gate regions, by exposing the 2DEG topside film surface by wet and/or dry etching of dielectric materials including the 2DEG passivation, providing an exposed region suitable for nickel Gate electrodes, or similar (see FIG. 21).

Next a $10^{th}$ masking level is used to define the Gate Electrode metal pattern. This mask is then formed to pattern photoresist and Ni is deposited and then lift-off of photoresist followed by thermal anneal as desired to provide the Gate electrodes 160, and additional interconnect/Gate metal via pads (see FIG. 22).

Typically, HSQ/SOG/Polyimide or other thick dielectrics 140 are next applied and/or bake cured by standard practice to improve VDS blocking voltage, and additional surface protection of the MOCVD 2DEG films 100. Additionally, an application of a dielectric material such as spin-on-glass 140 or the like may help to planarize the substrate 45 surface as desired. The substrate 45 can be surface polished to help further planarize the surface topology as desired. During planarization, the top surface of the substrate 45 can be chemically and/or mechanically polished down to about the top surface of the silicon substrate material as desired to facilitate the contact masking level 11 (see FIG. 23). This next $11^{th}$ masking level is employed to provide contact vias by exposing contact regions to the Gate via metal pads, and Transfer LDMOS Source contact regions ($N^+/P^+$). The poly Gate material 155 is typically wet/dry etched to expose the $P^+$ contact 70, $N^+$ Source regions 145 and additional Gate via pad regions as desired. The contact regions are dry and/or wet etched to expose by removing top surface dielectric material such as Polyimide/SOG, LTO, or similar exposing the desired contact regions (see FIG. 24). Next topside metal (1-6 um) is deposited to provide a robust, and reliable metallization for wire bonding, Sintering, Soldering, or similar. The substrate 45 is typically then deposited with Al, Ti, Ni, Au, or other like topside metallization(s) 180' to provide good ohmic contact to the $N^+$ Source 145, and $P^-/P^+$ diffusions 75/70, along with Gate via pads as necessary. The topside metallization 180' is then patterned using the $12^{th}$ masking level, to define the Source and Gate topside metal regions 30, 35 by wet and/or dry etching of exposed metal(s), followed by standard metal anneal. Typical topside metallization thickness is about 4 um to about 6 um. In this example case 6 um of Al/2% (Si/Cu) is used to provide for a wire bondable topside metal layer (see FIG. 25).

The substrate 45 is typically then coated with a top side passivation layer 195 to protect the surface of the device 10 from contamination and/or surface damage. The passivation layer 195 is typically about 4KÅ-8KÅ in thickness of deposited silicon nitride and/or PSG or other suitable passivation film (see FIG. 26). This is then followed by a $13^{th}$ masking layer used to pattern the topside passivation to expose the Source, and topside Gate metal electrodes/pads 160. Additionally, to provide topside solder pads/balls, a $14^{th}$ mask can be employed using a thick polyimide, or Kapton film to provide for application of solder paste followed by IR reflow as desired.

If an aggressive thinning of the substrate 45 is desired, such as for thin substrate products typically without epitaxial layer(s), the substrate 45 is typically mounted to a carrier substrate for ease of handling and added surface protection, and more typically is thinned using mechanical and/or chemical polishing and/or etching techniques.

Typically, an $N^+$ ion implantation may be desired to yield for good ohmic contact to Drain/2DEG regions, such as to yield a non-buffer layer device. In this case, a rapid thermal anneal may be performed to activate the implanted dopants. For example, a 2DEG $N^+$ Drain implant may be created without $N^-$ epi 50 or $N^+$ buffer regions 55.

On the other hand in this example case, a THEMT device 10 with a silicon substrate 45, an $N^+$ buffer layer 55, and a topside $N^-$ epitaxial layer 50 would not typically require the support of a carrier substrate (not shown).

The substrate 45 may be back side metalized, such as by adding Ti/Ni/Ti/Ag metallization 205. This process is typically followed by a (typically 400° C.) anneal, more typically carried out in $N_2$ forming gas or a like environment (see FIG. 27). The carrier substrate if used, is then typically disengaged and the substrate 45 is tested, sawn, and the final product die singulation is carried out.

In operation, the process for producing a THEMT or like device 10 may be summarized as follows. The steps of the process are given as FIGS. 28A-28B. Although the steps are described below as being sequential or as being 'subsequent', it will be appreciated that some steps may be taken simultaneously.

In the first step 300, a silicon or like substrate 45 is provided, wherein the substrate 45 has a substantially flat topside 61 and a substantially flat, oppositely disposed bottomside 62. The substrate 45 typically includes an epitaxial layer 50 at least partially covering the topside 61, and more typically includes a buffer layer 55 there-between. In a subsequent step 305, a first dielectric layer 60 is formed over the substrate 45 and/or the epitaxial layer 50. In a subsequent step 310, a photoresist layer 65 is deposited over the first dielectric layer 60. In a subsequent step, 315, a predetermined portion of the photoresist material 65 is removed to define a negative photoresist pattern 69. In a subsequent step 320, a predetermined portion of the first dielectric layer 60 corresponding to the negative photoresist pattern 69 is removed to define exposed portion(s) 67. In a subsequent step 325, dopants are implanted into the exposed portion 67 to define doped portion(s) 70. In a subsequent step 330, silicon or substrate material is preferentially removed from the exposed portion(s) 67 to generate trenches 20 having V-shaped cross-sections and having first and second angled sidewalls defining the V-shaped cross-section, wherein each angled sidewall defining the V-shaped cross-section is a silicon face having a [111] orientation. In a subsequent step 335, the remaining first dielectric layer 60 is removed, and, in another subsequent step 340, a growth promoter layer 210 may be applied to the at least one sidewall. In a subsequent step 345, a stress buffer layer(s) 115 may be applied to the at least one sidewall, and in another subsequent step 350, a 2DEG 100 is formed on the sidewall. Specifically, in some embodiments the 2DEG may be formed through a 2DEG forming operation 355 by first forming GaN layer(s) 115 on the at least one sidewall, then an $Al_{0.27}Ga_{0.73}N$ layer 115 is formed via $Al_{0.27}Ga_{0.73}N$ forming operation 360 over the first GaN layer(s) 115, and then a final GaN layer 105 is formed via GaN layer forming operation 365 over the $Al_{0.27}Ga_{0.73}N$ layer 115 to yield a 2DEG layer 100. In a subsequent step 370, a second dielectric 120 layer is deposited over the at least one sidewall, and in another subsequent step 375, a first buffer layer 376 is formed to at least partially cover the bottomside 62. In a subsequent step 377, Gate oxides are applied to predetermined portions of the topside 61 to define Gate regions. In a subsequent step 380, a Drain is formed on the bottomside; in some embodiments this is accomplished by the step 381 of forming at least one ohmic contact 125 in the first buffer layer to define a Drain. In a subsequent step 385, another dielectric layer 140 is deposited to fill in trenches and planarize the substrate 45. In a subsequent step 390, the buffer layer 376 is doped to define a highly doped buffer layer 376'. In a subsequent step 400, a metallization layer is typically applied over predetermined portions of the topside 61 to define Source regions. In a subsequent step 405, a passivation layer is typically applied over the first metallization layer. In a subsequent step 410, the substrate 45 is typically thinned and in another subsequent step 415, the respective dopants activated. In a subsequent step 420, a metallization layer 40 is typically applied over the bottomside, and in another subsequent step 425, the substrate 45 is typically then metal annealed.

The doped layer typically has a dopant concentration of between about $10^{13}$ dopants per cubic centimeter and about $10^{18}$ dopants per cubic centimeter and the highly doped buffer layer typically has a dopant concentration of between about $10^{18}$ dopants per cubic centimeter and about $10^{20}$ dopants per cubic centimeter and is typically between about 1 micron thick and about 3 microns thick. The topside passivation layer is typically between about 0.4 micron thick and about 0.8 micron thick. The first dielectric layer is typically between about 1 Angstrom unit thick and about 10 microns thick and the first dielectric material is typically selected from the group including $SiO_2$, $Si_3N_4$, and combinations thereof.

The present novel technology lends itself to several devices, as detailed below. The following is not a comprehensive list of possible device configurations, but is intended to suggest but a few of the many possible devices that may benefit from the present novel technology.

Solar Cells:

Solar cells may be produced by etching the Si(100) or Si(110) starting surface orientation to create a Si(111) etched surface to yield a V-groove or trench 20 as described above, with a typical depth of about 10-200 um. Typically, the trench 20 is between about 25-50 um deep to yield to a 50-70% increase in surface area of the substrate 45. Compound semiconductor films 43 may then be engineered on the Si(111) etched surface, to create variable band-gap compound semiconductors capable of converting incident photon energy(s) to electron/hole pairs. The compound semiconductor P/N junction 47 may then be contacted using standard Ohmic contact techniques or the like, to yield a solar cell chip capable of efficiently absorbing photons due to the increased surface area arising from the trench components as well as making use of internal reflection/absorption of the V-groove structure for capturing photons.

Light Emitting Diodes (LEDs):

LEDs may be produced by etching the Si(100), or Si(110) surface to expose the Si(111) planes as described above. As is the case with above described Solar Cell embodiment, LEDs would also benefit from a 50-70% increase in available surface area, thus providing for more photon output per unit area. The grooved surface also allows for reflective angles that urge light emission. Compound semiconductor films 43 may then be used to elicit the various light emission frequencies. In addition, the V-groove may be filled with phosphor material to help modulate the quality of the light. In addition, the structure can be made with either a top-side or a bottom-side reflective coating. Ohmic contacts to the P/N junction may be made from either top or bottom surfaces using standard methods.

Sensors:

Sensors may be produced by etching the Si(100), or Si(110) surface to expose the Si(111) planes, followed by the production of a compound semiconductor film 43, such as GaN/AlGaN, to create a piezoelectric induced displacement charge. As the silicon/compound semiconductor sensor surface experiences mechanical strain, the piezoelectric character of the GaN films 43 is then employed to sense these strains as a change in charge or capacitance related to the sensing structure, to produce, for example, capacitive coupled sensor or typical Wheatstone bridge sensor. As GaN films have desirable piezoelectric properties, these devices offer better mechanical sensitivity/sensor performance (at reduced cost) and still allow for CMOS to be integrated into the same die.

CMOS—Compound Semiconductor Films on Same Chip/Die:

The possibility of starting with the Si(100) plane or surface substrate orientation and then etching in the Si(111) plane for compound semiconductor film 43 growth allows for the integration of CMOS, DMOS, or similar digital transistor technology to be integrated along with the GaN structure on the same die. Bipolar devices may likewise be designed into the same monolithic chip as the compound semiconductor device structures.

Trench Light Emitting Diode Filaments (TLED-Fs):

TLED-Fs may be fabricated by, typically, first etching a silicon (or like material) substrate Si(100) or Si(110) surface orientation to etch out Self-Limiting Stable Profiles or geometric Si(111) surface planes. The exposed Si(111) surface area will allow for as much as 30-70% more light producing surface area per TLED Die, thus enabling additional photon output per die unit area. TLED fabrication using silicon substrate material offers the possibility of low cost and high quality large diameter (8-16 in) starting materials. The silicon etched surface is then further processed to first complete a Trench Light Emitting Diode (TLED) device as described above.

Further, the bottomside of the completed TLED silicon substrate may then be further thinned. The silicon substrate may then be (dry or wet) etched (isotropic or anisotropic), and may be etched to completely and/or to substantially remove silicon substrate material.

In some cases, it may be desirable to partially remove the silicon substrate material to allow for the formation of additional complex topside semiconductor surface device structures, such as DMOS, CMOS, bipolar, or like chip technology to then be safely fabricated as a monolithic chip along with the compound semiconductor devices as outlined above.

The substrate may then be composed of fully silicon etched compound semiconductor TLED filament structures, or TLED-F dice with the silicon completely or substantially etched away, thereby further increasing the photon light emission in a similar manner as a light filament used in a standard incandescent light bulb. Alternate embodiments may, for example incorporate monolithic TLED-F device structures and dimmer/timer CMOS circuitry on the same chip.

One embodiment TLED-F chip may be produced by thinning the typical silicon trench LED (TLED) substrate technology, as outlined above, to about 75 um to about 100 um, and then removing or substantially reducing the remaining silicon substrate, such as by wet etch KOH, TMAH, or non-chlorinated dry etch chemistry. This will ensure that the compound semiconductor TLED-F film stack crystalline materials are not inadvertently etched, leaving a compound semiconductor integrated filament-like structure suitable for further standard substrate manufacturing processes.

Trench High Electron Mobility Transistor—Filament (THEMT-F):

FIG. 30 illustrates a transistor device utilizing the trench geometry in greater detail. A substrate 45 having a pair of angled faces or in-planes 90 defining a trench 20 is shown in cross-section. The faces converge upon an Ohmic contact region 125, such as Ti seed/Ni plating. A passivation layer 120, such as silicon nitride, partially covers the sides of the contact region 125, which a Drain contact 40 likewise connects thereto, either directly or thorough vias 113.

The trench faces 90 are coated with multiple layers of materials, the first layer adjacent to the substrate 45 being a nucleation layer 210, such as AlN, AlN/GaN and typically about 1-3KÅ thick. Next, a buffer layer 115 is interposed between the nucleation layer 210 and a GaN 2DEG layer 105. The buffer layer is typically $Al_xGa_yN/GaN$ with $0 \leq x \leq 1$, $0 \leq y \leq 1$, and $x+y=1$, or the like. The buffer layer is typically about 1-5 μm thick. The GaN 2DEG layer is typically about 100-500 Å thick and has a typical composition of $Al_{0.27}Ga_{0.73}N$.

A cap layer is interposed between the GaN 2DEG layer and a layer of 2DEG metal. The cap layer is typically about 10-20 Å thick and made of undoped GaN. The 2DEG metal layer is typically layered Ti Al/Au, and is about 1/2/1 KÅ thick.

A passivation layer is formed over the metal layer. The passivation layer 120 is typically silicon nitride and about 1-4 KÅ thick. The trench 20 is filled in with an inter-dielectric, such as polyimide. The device is coated with a topside metallization, such as Al, typically 4-6 μm thick, which is in turn covered by a topside passivation layer 195, such as silicon nitride 4-8 KÅ thick.

Detailed Process Example TLED-F:

Starting with an N⁻ type Si(100) substrate 500 instead of a Si(111) substrate orientation, the Si(100) silicon substrate is first deposited via deposition process 510 with $Si_3N_4$ and/or $SiO_2$ (1 Å-10KÅ) hard mask layer 520. Standard photo-tools can be used to pattern photoresist used to pattern the hard mask oxide layer 520. After etching via etching process 530 the oxide mask 520, the exposed Si surface 540 is now cleaned and prepared for anisotropic chemical silicon wet etching process 550.

Anisotropic Silicon Wet Etching Process:

After application of the silicon etch mask 510 and wet etching processes 550, the Si(100) starting substrate orientation is then anisotropically etched 560 to define one or more self-limiting geometric surfaces 570, composed of etched Si(111) planes and/or a combination of partially etched planes to a depth of 50 um. Typical etch rates for silicon TMAH wet etching are 1 um/min.

Wafer Cleaning after Silicon Etch:

The etched substrate is then exposed to a general buffered oxide etch (BOE/1-15 sec) (or other standard cleaning etches, such as an RCA clean/1-10 sec or the like). In other embodiments, standard substrate cleaning processes 580 may be used to remove any residue $Si_3N_4$ and/or $SiO_2$, or foreign metal/organic contaminate materials.

Compound Semiconductor Film Growth:

The entire cleaned etched substrate 500 surface 585 is then deposited or grown 590 with compound semiconductor crystalline materials and/or additional material layers 595 to form the final compound semiconductor TLED film structure 600. This is generally achieved by a high temperature $H_2$ substrate pre-clean, followed by metal organic chemical vapor deposition (MOCVD), hydride vapor phase epitaxial (HVPE), or like processes/tools/methods. It should be appreciated that many different processes/tools/methods may be used, by which a compound semiconductor material and/or other film 595 can be grown or deposited 590 on an etched silicon substrate 575 or like substrate material. These would include, but are not limited to, a stress relief buffer layer composed of $Al_2O_3$, and/or AlN, GaN, N or P type GaN, AlGaN, TiO, GaAs, ZnO, or like compounds, or single-phased Ge, Si, Ga, or like semiconductors, and/or $SiO_2$, $Si_3N_4$, or like layers to reduce defect density, and/or multiple quantum wells (MQWs), such as of $In_{(x\%)}Ga_{(1-x\%)}N/GaN$, for additional photon emission/frequency control, and the like.

Transparent/Reflective Ohmic Contacting Layer(s):

After film growth/deposition (in this example, to a depth of about 3-4 um), one or more transparent metal layer(s) (such as Au, Ni, Indium Tin Oxide (ITO), or like suitable films) are deposited via a deposition process 610 to provide for a transparent Ohmic contact material layer 615 to the compound semiconductor N and/or P type material layer(s) 595. This layer may be thickened 620 and used as a reflective/refractive layer 625 for flip chip applications, for example, to increase photon output of the TLEDF completed structures by providing a bottom side reflective surface 625. Typically, the Ohmic contact layer 615 is deposited 610 by CVD or the like.

MOCVD/HVPE Film Stack Protective Layer:

The transparent/reflective metal layer(s) 625 may then be coated via coating process 630 with a thin protective layer (10 Å-10,000 Å) of silicon nitride or other suitable. The silicon nitride layer may also provide a subsequent Ohmic contact masking layer as desired.

Overcoat Planarization:

The substrate 500 is then planarized through a planarization process 640 such as by use of polyimide, spin-on-glass/dielectric material, or the like. The topside silicon substrate etched volume 645 is then typically filled 650 and utilized with a phosphor doped thermo-set material 655 to provide light softening and/or color. For example, a single or multi-layer coating of a polyimide spin-on film may be deposited, followed by coating of spin-on-glass/dielectric material, typically doped with phosphor, to fill in the 50 um etched substrate topside surfaces to provide for a stable working surface for subsequent substrate polishing/planarization. Typically, these films require a soft bake (150° C./2-3 min) followed by a hard bake below 350° C. for (30-60 min). Film thickness, per pass, of about 1 um to about 20 um are easily achievable.

Chemical Mechanical Surface Polishing:

The substrate 500 may then be chemically and/or mechanically polished 660 for flatness and additionally polished as desired to yield a smooth substrate surface.

Contact Etching of Topside N/P Materials:

After the substrate 500 is planarized 640, a polyimide dielectric top layer 675 or the like is typically patterned 670 thereupon to allow for etching down to the appropriate P and/or N type compound semiconductor layer(s) 595. These layers 595 may be further etched with a separate standard masking layer to expose the appropriate P and/or N type compound semiconductor material layer(s) for additional Ohmic contact(s) 615 as desired.

Topside Metallization and Etch:

Metallization layer(s) 695 is/are then deposited by a deposition process 690 and metal inter-connect mask patterning/etching 700 of metal layer(s) is done. In some cases the order of etching and metal layer deposition may be mixed for efficiency and/or to reduce processing steps, as desired.

Topside Passivation and Etch:

After the final metal layer 695 is etched patterned 700 for die surface interconnect, a single or, more typically, dual pass (for pinhole protection) final passivation layer 715 is deposited through a deposition process 710 onto the substrate 500, such as 2-8KÅ of silicon nitride deposited and etched to expose the bonding pads or final solderable metallization surface pads. The silicon nitride film, or like suitable passivation film, may also be left un-etched to allow for full and complete topside surface protection during subsequent silicon wet/dry etching process step(s), and may then be pad etched later in the process flow.

Solder Bumping of Wafer:

For a green package using lead-free solder flip-chip, or sintered direct surface mount package format, an additional lead free solder mask 735 may be applied 730 to process a final solder/sinter surface and/or ball(s). This final sinter/solderable ball/layer/pattern 735 may then be used for direct surface mount applications as desired without need for additional solder materials.

Silicon Wafer Thinning and Filament Etch:

The silicon nitride surface coat 520, 675, and/or by use of substrate surface metals/films 605, 625, 695 that resist degradation during standard silicon wet etching the substrate 500 is prepared 740 for partial or complete silicon etching, which typically includes a mechanical grinding operation 740 to thin the substrate 500 to reduce the final silicon etching time and cost.

The substrate 500 is then exposed to a wet etch bath of KOH, TMAH, or other standard bulk silicon wet/dry etching assent to selectively etch the substrate 500, leaving behind the compound semiconductor filament structure, continuous topside film(s), and/or silicon device structure(s) 755 if a partial etch is used.

Final Wafer Surface Coat:

The compound semiconductor filament structure 755 substrate 500 is then surface coated 760 using standard substrate processing equipment and materials such as SOG/D, polyimide, phosphor doped thermo-set liquid material that is spin coated and bake hardened, or any other suitable topside coating for color control, reflectivity, refractive index, or the like.

Final Test and Deliver Methods:

The finished compound semiconductor substrate 765 is typically then cleaned 770. A substrate test 780 is usually then performed for quality control, and then the substrate 765 is then cut 790 into individual portions 795, such as to be used as a fully tested final assembly chip scale packaged device.

In this final chip scale package format, the sawn good die 795 can then be placed into pocket tape, waffle pack, or mounted/used directly from sawn expanded nitto frame. In this way, the device 795 may be mounted 800 directly onto the final substrate 805 suitable for TLEDF solid state lighting applications or the like, without the need for further device packaging or electrical testing costs.

Final Device Mounting Methods:

The TLEDF die having separate solderable anode and cathode pads, for example, allows for the device to be lead-free solder IR reflowed, sintered, conductively glued, or other similar method/materials onto the downstream circuit board application. A wire bondable 2-5 mil wire bonding pad version allows for chip-n-wire applications.

Applications:

TLEDF device applications may include: commercial/residential light bulbs, automotive displays, head/tail lamps, traffic lights, outdoor lighting, backlight/head up displays, flat panel displays, flashlights, and numerous other commercial, aerospace, military, and general purpose LED applications.

Solar Cells:

The above TLEDF chip may give rise to a MOCVD or HVPE compound semiconductor photo voltaic solar cell device structure. For example, a solar cell device may be transparently encapsulated by SOD/SOG and/or polyimide films, allowing for sunlight to penetrate the packaged device from all directions increasing the device's performance and ease of use. The thinness of the device and the inherently flexible film structures may allow for wearable/moldable large area solar cells.

By using low cost silicon based starting material, manufacturing and efficient thin film variable bandgap compound semiconductor MOCVD/HVPE solar cell film engineering a low cost technology platform for new and existing solar cell applications is achieved.

Sensors:

The above chip 10 may likewise give rise to a more substantially etched silicon substrate with P type Boron layer(s) acting as etch stops, along with fabricated solid self-limiting features that may not be fully etched (p⁻ type etch stopped if desired, such as an inverted trapezoid) in which the bottom face is partially etched to the Si(100) or Si(110) plane. This structure, would then be film deposited/grown with a piezo-electric AlGaN/GaN for example, or other suitable sensing selected for its inherent sensitivities to changes in the mechanical stresses or other properties induced in the film. For example, a wheat-stone capacitive and/or resistive bridge network sensor structure could be fabricated in which silicon etched surfaces are MOCVD deposited with piezo-electric charge sensitive films. This structure would yield comprise a balanced resistive Wheatstone bridge, capacitively coupled bridge, or numerous other sensor device structures sensitive to changes in charge, resistance, capacitance, magnetic flux fields, electric fields, photon fluctuations, and numerous like film sensing characteristics. Etching away the bottom portion of the silicon substrate allows for a partially or fully etched exposure of the compound piezo-electric crystalline film, allowing for a sensing structure that can then be used in various sensing applications including, biomedical and space applications, which may benefit from the increased sensitivity of various compound semiconductor film structures.

Vertical THEMT Power Devices:

THEMT power devices may benefit from a backside thinning process, can then be silicon wet/dry etched, to substantially reduce the remaining silicon and expose only the compound semiconductor for further isolation and Drain metal connection. From this backside silicon etched surface, standard substrate manufacturing processes may be used to apply polyimide and/or spin-on-glass dielectric, or other suitable dielectric material. These dielectric materials help isolate the Drain compound semiconductor connection, from the silicon/compound semiconductor Source connection scheme. This standard process method allows for very high blocking voltage ($V_{DS}$>1 KV).

After the dielectric layer is formed, the backside surface is prepared for Drain connection backside metal and annealing process steps to the exposed and isolated compound semiconductor Drain material.

Similar to the TLEDF, this process method would allow for substrate test/die separation, and mounting into a standard solderable/sintered package style (dual sided cooling), or chip 'n' Al wire package styles (DPAK/PSO8/D²PAK) such as based on green lead free tin/silver solder packaging technologies.

While the invention has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the invention are desired to be protected.

I claim:

1. A method for producing a solid-state device, comprising: a) on a silicon substrate having a substantially flat topside and a substantially flat, oppositely disposed bottomside, forming a first dielectric layer over an epitaxial layer at least partially covering the topside; b) depositing a photoresist material over the first dielectric layer; c) removing a predetermined portion of the photoresist material to define a negative photoresist pattern; d) removing a predetermined portion of the first dielectric layer corresponding to the negative photoresist pattern to define an exposed portion; e) implanting dopants into the exposed portion to define a doped portion; f) removing silicon from a second exposed portion to generate trenches having V-shaped cross-sections and having first and second angled sidewalls defining the V-shaped cross-section, wherein each angled sidewall defining the V-shaped cross-section is a silicon face having a 111 orientation, and wherein the first dielectric is removed prior to the removal of silicon from the second exposed portion; g) removing remaining first dielectric layer; h) forming a 2DEG on at least one sidewall; i) depositing a second dielectric layer over the at least one sidewall; j) forming a first buffer layer in electric communication with the bottomside; and k) forming at least one ohmic contact in the first buffer layer to define a drain; wherein the first buffer layer is formed before forming the first dielectric layer and prior to forming the epitaxial layer.

2. The method of claim 1 and further comprising: m) doping the first buffer layer to define a highly doped buffer layer; n) applying gate oxides to define gate regions; p) applying a passivation layer; q) activating the respective dopants; r) annealing the silicon substrate; wherein the passivation layer is between about 0.4 micron and about 2 microns thick.

3. The method of claim 2 wherein the doped portion has a dopant concentration of between about $10^{13}$ dopants per cubic centimeter and about $10^{18}$ dopants per cubic centimeter; and wherein the highly doped buffer layer has a dopant concentration of between about $10^{18}$ dopants per cubic centimeter and about $10^{20}$ dopants per cubic centimeter.

4. The method of claim 2 wherein the highly doped buffer layer is between about 1 micron thick and about 3 microns thick; wherein the passivation layer is between about 0.4 micron thick and about 0.8 microns thick; and wherein the first dielectric layer is between about 1 Angstrom unit thick and about 10 microns thick.

5. The method of claim 1 wherein the first buffer layer begins between 10 microns and 800 microns from the bottomside.

6. A method for producing a transistor device, comprising: a) on a silicon substrate having a substantially flat topside and a substantially flat, oppositely disposed bottomside, forming a first dielectric layer over an epitaxial layer at least partially covering the topside; b) depositing a photoresist material over the first dielectric layer; c) removing a predetermined portion of the photoresist material to define a negative photoresist pattern; d) removing a predetermined portion of the first dielectric layer corresponding to the negative photoresist pattern to define an exposed portion; e) implanting dopants into the exposed portion to define a doped portion; f) removing silicon from a second exposed portion to generate trenches having V-shaped cross-sections and having first and second angled sidewalls intersecting to define the V-shaped cross-section, wherein each angled sidewall defining the V-shaped cross-section is a silicon face having a 111 orientation and wherein the first dielectric is removed before removing silicon from the second exposed portion; g) removing remaining first dielectric layer; hi) applying a growth promoter to the at least one sidewall; h2) after hi), applying a stress buffer layer to the at least one sidewall; h3) after h2), forming a first GaN layer on the at least one sidewall; h4) after h3), forming an $Al_{0.27}Ga_{0.73}N$ layer over the first GaN layer; h5) after h4), forming a second GaN layer over the $Al_{0.27}Ga_{0.73}N$ layer to yield a 2DEG layer; i) depositing a third dielectric layer over the at least one sidewall; j) forming a first buffer layer in electric communication with the bottomside; k) forming at least one ohmic contact in the first buffer layer to define a Drain; l) depositing a second dielectric layer to fill in trenches and planarize the silicon substrate; m) doping the first buffer layer to define a highly doped buffer layer; n) applying gate oxides to predetermined portions of the topside to define Gate regions; o) applying a first metallization layer over predetermined portions of the topside to define source regions; p) applying a passivation layer over the first metallization layer; r) activating the respective dopants; s) applying a second metallization layer over the bottomside; and t) after s), annealing the substrate; wherein the doped portion has a dopant concentration of between about $10^{13}$ dopants per cubic centimeter and about $10^{18}$ dopants per cubic centimeter; wherein the highly doped buffer layer has a dopant concentration of between about $10^{18}$ dopants per cubic centimeter and about $10^{20}$ dopants per cubic centimeter; wherein the highly doped buffer layer is between about 1 micron thick and about 3 microns thick; wherein the passivation layer is between about 0.4 micron thick and about 0.8 microns thick; wherein the first dielectric layer is between about 1 Angstrom unit thick and about 10 microns thick; and wherein the first dielectric material is selected from the group including $SiO_2$, $Si_3N_4$, and combinations thereof; wherein the first buffer layer is formed before forming the first dielectric layer and prior to forming the epitaxial layer.

7. The method of claim 6 wherein the at least one ohmic contact is disposed at the intersection of the first and second angled sidewalls and wherein the ohmic contact extends into the first buffer layer.

* * * * *